(12) United States Patent
Champion

(10) Patent No.: US 6,765,580 B2
(45) Date of Patent: Jul. 20, 2004

(54) PIXEL PAGES OPTIMIZED FOR GLV

(75) Inventor: Mark Champion, Kenmore, WA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 239 days.

(21) Appl. No.: 10/076,965

(22) Filed: Feb. 15, 2002

(65) Prior Publication Data

US 2002/0109699 A1 Aug. 15, 2002

Related U.S. Application Data

(60) Provisional application No. 60/324,498, filed on Sep. 24, 2001, provisional application No. 60/269,783, filed on Feb. 15, 2001, and provisional application No. 60/269,784, filed on Feb. 15, 2001.

(51) Int. Cl.[7] ............................................... G09G 5/36

(52) U.S. Cl. ..................... 345/545; 345/539; 345/540

(58) Field of Search ............................. 345/531, 536, 345/537, 539, 545, 540

(56) References Cited

U.S. PATENT DOCUMENTS

| | | | |
|---|---|---|---|
| 4,449,199 A | | 5/1984 | Daigle |
| 5,142,276 A | * | 8/1992 | Moffat ........................ 345/545 |
| 5,195,182 A | | 3/1993 | Sasson |
| 5,303,341 A | * | 4/1994 | Rivshin ...................... 358/1.17 |
| 5,479,605 A | * | 12/1995 | Saitoh ........................ 345/561 |
| 5,559,953 A | | 9/1996 | Seiler et al. |

(List continued on next page.)

OTHER PUBLICATIONS

Lieberman, David; *Sony champions MEMS display technology*; EE Times, Jul. 14, 2000; http://www.eetimes.com/story/OEG20000714S0004.

U.S. patent application Ser. No. 10/051,538, Champion, filed Jan. 16, 2002.
U.S. patent application Ser. No. 10/051,541, Champion, filed Jan. 16, 2002.
U.S. patent application Ser. No. 10/051,680, Champion, filed Jan. 16, 2002.
U.S. patent application Ser. No. 10/052,074, Champion, filed Jan. 16, 2002.
*SMPTE Standard for Television 1920 × 1080 Scanning and Analog and Parallel Digital Interfaces for Multiple Picture Rates*; SMPTE 274–1998; Copyright 1998; pp. 1–24; Revision of ANSI/SMPTE 274M–1995; The Society of Motion Picture and Television Engineers; White Plains, New York.
Bloom, D.M.; *The Grating Light Valve: revolutionizing display technology*; pp. 1–10; Silicon Light Machines (formerly Echelle, Inc.).
Corrigan, R.W., et al.; *An Alternative Architecture for High Performance Display*; Presented at the 141st SMPTE Technical Conference and Exhibition; Nov. 20, 1999, New York, New York; pp. 1–5; Silicon Machines, Sunnyvale, CA.

(List continued on next page.)

*Primary Examiner*—Matthew C. Bella
*Assistant Examiner*—Mackly Monestime
(74) *Attorney, Agent, or Firm*—Thomas F. Lebens; Fitch, Even, Tabin & Flannery

(57) ABSTRACT

Methods and apparatus for implementing a pixel page system providing pixel pages optimized for use with a GLV (grating light valve). In one implementation, a system includes: a data source, providing pixel data for pixels in a first order, each pixel in a frame having rows and columns of pixels; a data destination, receiving pixel data for pixels in a second order; at least one memory device including memory pages having memory locations; pixel data for each pixel corresponds to an entry in a pixel page, each pixel page having rows and columns and including pixels, the pixel pages optimized for use with a GLV. Pixel data is stored to memory in the first order and retrieved in the second order. And each memory page stores pixel data in multiple locations according to the first order and stores pixel data in multiple locations according to the second order.

11 Claims, 20 Drawing Sheets

U.S. PATENT DOCUMENTS

| | | | | |
|---|---|---|---|---|
| 5,561,777 | A | 10/1996 | Kao et al. | |
| 5,579,473 | A | 11/1996 | Schlapp et al. | |
| 5,606,650 | A | 2/1997 | Kelley et al. | |
| 5,619,471 | A | 4/1997 | Nunziata | |
| 5,633,726 | A | 5/1997 | Timmermans | |
| 5,781,201 | A | 7/1998 | McCormack et al. | |
| 5,794,016 | A | 8/1998 | Kelleher | |
| 5,798,843 | A | * 8/1998 | Yamamoto et al. | 358/404 |
| 5,815,167 | A | 9/1998 | Muthal et al. | |
| 5,815,169 | A | 9/1998 | Oda | |
| 5,924,111 | A | 7/1999 | Huang et al. | |
| 5,933,154 | A | 8/1999 | Howard et al. | |
| 6,005,592 | A | 12/1999 | Koizumi et al. | |
| 6,031,638 | A | 2/2000 | Rao et al. | |
| 6,111,992 | A | 8/2000 | Likhterov et al. | |
| 6,177,922 | B1 | * 1/2001 | Schiefer et al. | 345/698 |
| 6,226,709 | B1 | 5/2001 | Goodwin et al. | |
| 6,259,459 | B1 | 7/2001 | Middleton | |
| 6,278,645 | B1 | 8/2001 | Buckelew et al. | |
| 6,301,649 | B1 | 10/2001 | Takasugi | |
| 6,331,854 | B1 | 12/2001 | Rogers et al. | |
| 6,347,344 | B1 | 2/2002 | Baker et al. | |
| 6,417,867 | B1 | 7/2002 | Hallberg | |
| 6,496,192 | B1 | * 12/2002 | Shreesha et al. | 345/540 |
| 6,549,207 | B1 | 4/2003 | Matsumoto | |
| 6,567,531 | B1 | 5/2003 | Kondo et al. | |
| 6,587,112 | B1 | 7/2003 | Goeltzenleuchter et al. | |
| 2002/0109689 | A1 | 8/2002 | Champion | |
| 2002/0109690 | A1 | 8/2002 | Champion | |
| 2002/0109692 | A1 | 8/2002 | Champion | |
| 2002/0109693 | A1 | 8/2002 | Champion | |
| 2002/0109694 | A1 | 8/2002 | Champion | |
| 2002/0109695 | A1 | 8/2002 | Champion | |
| 2002/0109696 | A1 | 8/2002 | Champion | |
| 2002/0109698 | A1 | 8/2002 | Champion | |
| 2002/0110030 | A1 | 8/2002 | Champion | |
| 2002/0110351 | A1 | 8/2002 | Champion | |
| 2002/0130876 | A1 | 9/2002 | Champion | |
| 2002/0149596 | A1 | 10/2002 | Champion | |
| 2003/0058368 | A1 | 3/2003 | Champion | |
| 2003/0151609 | A1 | 8/2003 | Champion | |

OTHER PUBLICATIONS

Hearn, D., et al.; *Computer Graphics C Version* [2d Ed.]; pp. 53–56; Prentice Hall, Upper Saddle River, New Jersey.

McCarron, D., et al.; Accelerating PC Graphics, Emerging Technologies Edition, Market Strategy and Forecast Report; 1995; pp. 2–49 through 2–93, 2–159 (labeled as pp. 1–46); Mercury Research.

* cited by examiner

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

350  FIG. 3B
(Prior Art)

| 0 | 2 | 4 | 6 |
|---|---|---|---|
| 8 | 10 | 12 | 14 |
| 16 | 18 | 20 | 22 |
| 24 | 26 | 28 | 30 |

FIG. 3C  375
(Prior Art)

| 1 | 3 | 5 | 7 |
|---|---|---|---|
| 9 | 11 | 13 | 15 |
| 17 | 19 | 21 | 23 |
| 25 | 27 | 29 | 31 |

FIG. 6A
(Prior Art)
605

| 0 | 1 | ... | $2^{21}-1$ |

| A20 | ... | A9 | A8 | ... | A0 |

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |
| 64 | 65 | 66 | 67 | 68 | 69 | 70 | 71 | 72 | 73 | 74 | 75 | 76 | 77 | 78 | 79 |
| 80 | 81 | 82 | 83 | 84 | 85 | 86 | 87 | 88 | 89 | 90 | 91 | 92 | 93 | 94 | 95 |
| 96 | 97 | 98 | 99 | 100 | 101 | 102 | 103 | 104 | 105 | 106 | 107 | 108 | 109 | 110 | 111 |
| 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 |
| 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 |
| 240 | 241 | 242 | 243 | 244 | 245 | 246 | 247 | 248 | 249 | 250 | 251 | 252 | 253 | 254 | 255 |

FIG. 10

|  | 0 | 1 | 2 | ... | ... | ... | ... | ... | ... | 15 |
|---|---|---|---|---|---|---|---|---|---|---|
| 0 | 0 | 1 | 2 | ... | ... | ... | ... | ... | ... | 15 |
| 1 | 1920 | 1921 | 1922 | ... | ... | ... | ... | ... | ... | 1935 |
| 2 | 3840 | 3841 | 3842 | ... | ... | ... | ... | ... | ... | 3855 |
| ... | ... | ... | ... | ... | ... | ... | ... | ... | ... | ... |
| 15 | 28800 | 28801 | 28802 | ... | ... | ... | ... | ... | ... | 28815 |

FIG. 11

| | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1920 | 1921 | 1922 | ... | ... | ... | ... | 1927 |
| 2 | 3840 | 3841 | 3842 | ... | ... | ... | ... | 3847 |
| | ... | ... | ... | ... | ... | ... | ... | ... |
| | ... | ... | ... | ... | ... | ... | ... | ... |
| | ... | ... | ... | ... | ... | ... | ... | ... |
| | ... | ... | ... | ... | ... | ... | ... | ... |
| 31 | 59520 | 59521 | 59520 | ... | ... | ... | ... | 5927 |

| PIXEL | FRAME ROW | FRAME COLUMN | PIXEL PAGE | PIXEL PAGE ROW | PIXEL PAGE COLUMN | MEMORY BANK | MEMORY PAGE | MEMORY ADDRESS |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 7 | 0 | 7 | 0 | 0 | 7 | 0 | 0 | 7 |
| 8 | 0 | 8 | 1 | 0 | 0 | 1 | 0 | 0 |
| 15 | 0 | 15 | 0 | 0 | 7 | 1 | 0 | 7 |
| 16 | 0 | 16 | 2 | 0 | 0 | 2 | 0 | 0 |
| 24 | 0 | 24 | 3 | 0 | 0 | 3 | 0 | 0 |
| 32 | 0 | 32 | 4 | 0 | 0 | 0 | 1 | 0 |
| 1919 | 0 | 1919 | 239 | 0 | 7 | 3 | 59 | 7 |
| 1920 | 1 | 0 | 0 | 1 | 0 | 0 | 0 | 8 |
| 59520 | 31 | 0 | 0 | 31 | 0 | 0 | 0 | 248 |
| 59527 | 31 | 7 | 0 | 31 | 7 | 0 | 0 | 255 |
| 61440 | 32 | 0 | 240 | 0 | 0 | 0 | 60 | 0 |
| 2073599 | 1079 | 1919 | 8159 | 23 | 7 | 3 | 2039 | 191 |
| XXX | XXX | XXX | 8159 | 31 | 7 | 3 | 2039 | 255 |

1505  1510  1515  1520  1525  1530  1535  1540  1545

PIXEL PAGES OPTIMIZED FOR GLV

RELATED APPLICATIONS

This application claims the benefit of U.S. Provisional Application No. 60/269,784 filed Feb. 15, 2001, of U.S. Provisional Application No. 60/269,783 filed Feb. 15, 2001, and of U.S. Provisional Application No. 60/324,498 filed Sep. 24, 2001, the disclosures of which are incorporated herein by reference.

This application is related to the following co-pending and commonly assigned patent applications: U.S. application Ser. No. 10/051,538, filed Jan. 16, 2002 (Docket No. 71743); U.S. application Ser. No. 10/051,680, filed Jan. 16, 2002 (Docket No. 71744); U.S. application Ser. No. 10/052,074, filed Jan. 16, 2002 (Docket No. 71745); and U.S. application Ser. No. 10/051,541, filed Jan. 16, 2002 (Docket No. 71746), the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in megapixels per second ("MP/S"). For example, according to SMPTE 274M-1998 (a specification defining, among other things, pixel rates for resolutions of 1920×1080), for HD resolution 220 the pixel rate is about 150 MP/S @ 60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHz is approximately 500 MB/S. A frame buffer architecture using two 125 MHz SDRAM's can realize a data rate of approximately 1000 MB/S. Alternatively, a faster SDRAM, such as one running at 150 MHz, can meet 600 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. For example, frame buffer architecture 400 can be used in a typical scan converter. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

7. SDRAM

Various types of memory devices can be used in implementing a frame buffer. One common type of memory used is SDRAM (synchronous dynamic random access memory). The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8 MB SDRAM were each location is 8 bits has four times as many addressable locations. FIG. 6A is a representation of 2,097,152 memory locations as a one-dimensional array 605. Memory cells in a typical SDRAM are physically arranged in a two-dimensional grid and so individual cells can be identified using a combination of a row number and a column number. The memory locations within the same row are often collectively referred to as a "page." FIG. 6B is a representation of 2,097,152 memory locations as a two-dimensional array or grid 650 having X columns and Y rows. In FIG. 6B, grid 650 has 256 columns 655, from 0 to X−1, and 8192 rows or pages 660, from 0 to Y−1. Accordingly, the location in row y at column x has address (y*X+x). For example, location 665 (the first location in the last page) has address (X*(Y−1)) and location 670 (the last location in the last page) has address (X*Y−1). The sizes of the boxes representing locations in FIG. 6C are representative and not to scale, so different size boxes are not different size memory locations (e.g., locations 665 and 670).

An address for a memory cell can be viewed as a combination of a row address and a column address. FIG. 6C is a representation of an address 675 for one memory location out of 2,097,152. Address 675 has 21 bits, with A0 as the lowest order bit. The lower 8 bits, A0 to A7, are a column address 680, ranging from 0 to 255. The upper 13 bits, A8 to A20, are a row or page address 685, ranging from 0 to 8191.

Due to the nature of the construction of SDRAM, an entire page of memory cells is active at a time. Accessing cells within the same page can be accomplished relatively quickly using a series of column addresses without changing the page address. To change pages, a new page address is used and an additional delay is incurred from both the extra address cycle and a delay in the memory changing which page is active. This delay is referred to as a "page miss" and can result in a loss in speed. SRAM (static random access memory) typically does not incur the same page miss delay as SDRAM, but SRAM is typically more expensive than SDRAM.

In a conventional frame buffer using SDRAM, pixel data for horizontally neighboring pixels is typically stored in the same page of memory. Referring to FIGS. 1A and 1B, pixel data for pixels 0, 1, 2, and 3 would be stored in one page, pixel data for pixels 4, 5, 6, and 7 would be stored in another page, and so on. In a parallel architecture, such as architecture 400 in FIG. 4, a page stores pixel data for every other horizontally aligned pixel, such as the first page of memory device 350 storing pixel data for pixels 0, 2, 4, and 6 in FIGS. 3A and 3B. Storing and retrieving pixel data can be accomplished quickly with few page misses because pixel data in a conventional raster scan system is processed in row order (left to right, top to bottom) for both storing and retrieving. The pixel data for pixels in different rows are typically not stored in the same page, and so page misses occur when pixel data is to be stored or retrieved for pixels from different rows. For example, retrieving pixel data for pixels 0, 1, 2, and 3 would cause one page miss (the initial page miss in the first access), but retrieving pixel data for pixels 0, 4, 8, and 12 would cause four page misses.

SUMMARY

The present disclosure provides methods and apparatus for implementing a pixel page system providing pixel pages optimized for use with a GLV (grating light valve). In one implementation, a pixel page system includes: a data source, providing pixel data for pixels in a first order, where each pixel is in a frame of pixels, the frame having horizontal rows of pixels and vertical columns of pixels; a data destination, receiving pixel data for pixels in a second order; at least one memory device, each memory device having a plurality of memory pages including a plurality of memory locations, each memory location having an address; and where pixel data for each pixel corresponds to an entry in one of a plurality of pixel pages, each pixel page having a plurality of pixel page rows each including a plurality of pixels and a plurality of pixel page columns each including a plurality of pixels, where the pixel pages are optimized for use with a GLV, and where pixel data is stored to the memory device in the first order and retrieved from the memory device in the second order, and where each memory page stores pixel data in multiple locations according to the first order and stores pixel data in multiple locations according to the second order.

In another implementation, a method of storing and retrieving pixel data includes: storing pixel data for a first frame of pixels in a first memory device using pixel pages, where the first memory device includes a plurality of memory pages, and at least one memory page stores pixel data for at least two pixels from each of at least two horizontal rows of pixels in the first frame of pixels; storing pixel data for a second frame of pixels in a second memory device using pixel pages, where the second memory device includes a plurality of memory pages, and at least one memory page stores pixel data for at least two pixels from each of at least two horizontal rows of pixels in the second frame of pixels; retrieving pixel data for the first frame of pixels from the first memory device using pixel pages; and retrieving pixel data for the second frame of pixels from the second memory device using pixel pages, where the pixel pages are optimized for use with a GLV.

BRIEF DESCRIPTION OF THE DRAWINGS

FIG. 3A is a representation of a frame of pixels divided between two memory devices.

FIG. 3B is a representation of a first memory device.

FIG. 3C is a representation of a second memory device.

FIG. 6A is a representation of 2,097,152 memory locations as a one-dimensional array.

FIG. 6B is a representation of 2,097,152 memory locations as a two-dimensional array or grid.

FIG. 6C is a representation of an address for one memory location out of 2,097,152.

FIG. 7 is a representation of a frame of pixels according to the present invention.

FIG. 10 is a representation of one implementation of a pixel page of pixels in an HD resolution implementation according to the present invention.

FIG. 11 is a representation of one implementation of a pixel page of pixels in an HD resolution implementation according to the present invention.

FIG. 15 is a table 1500 showing the relationships among a pixel, a frame row, a frame column, a pixel page, a pixel page row, a pixel page column, a memory page, a memory address, and a memory bank for an HD resolution implementation (1920×1080) according to the present invention.

DETAILED DESCRIPTION

Figure 1A:
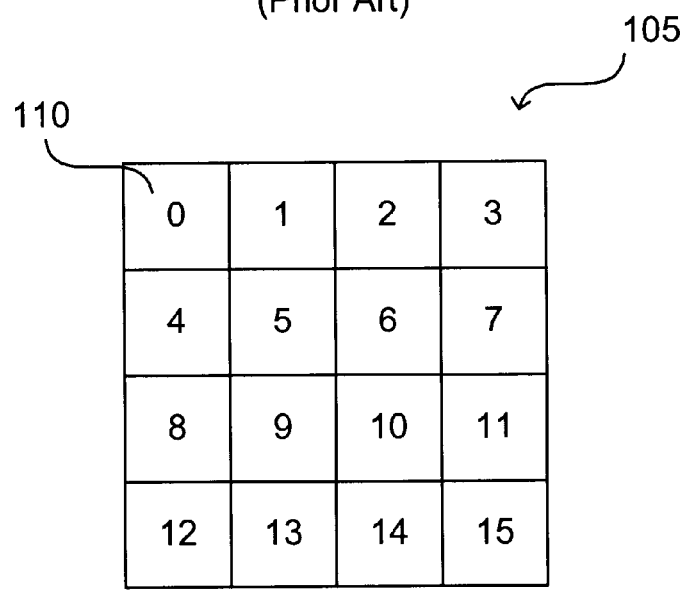
FIG. 1A is a representation of a screen as a grid of pixels.
Figure 1B:
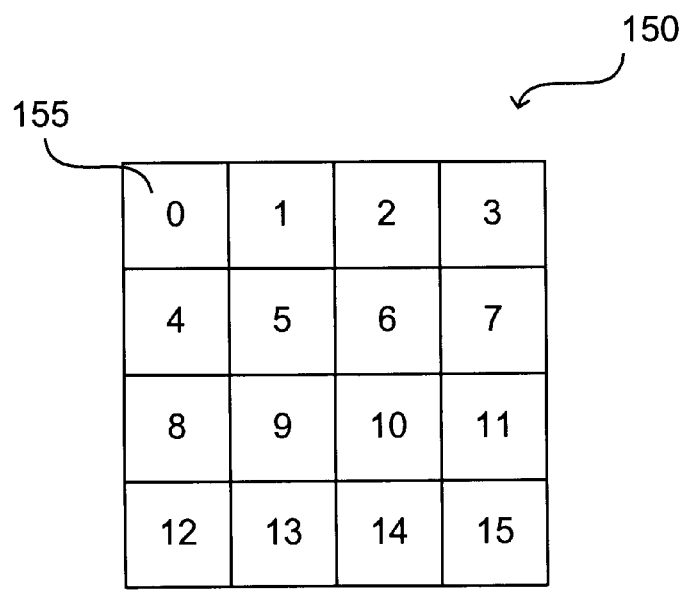
FIG. 1B is a representation of a memory device implementing a frame buffer as a grid of memory locations.
Figure 2:
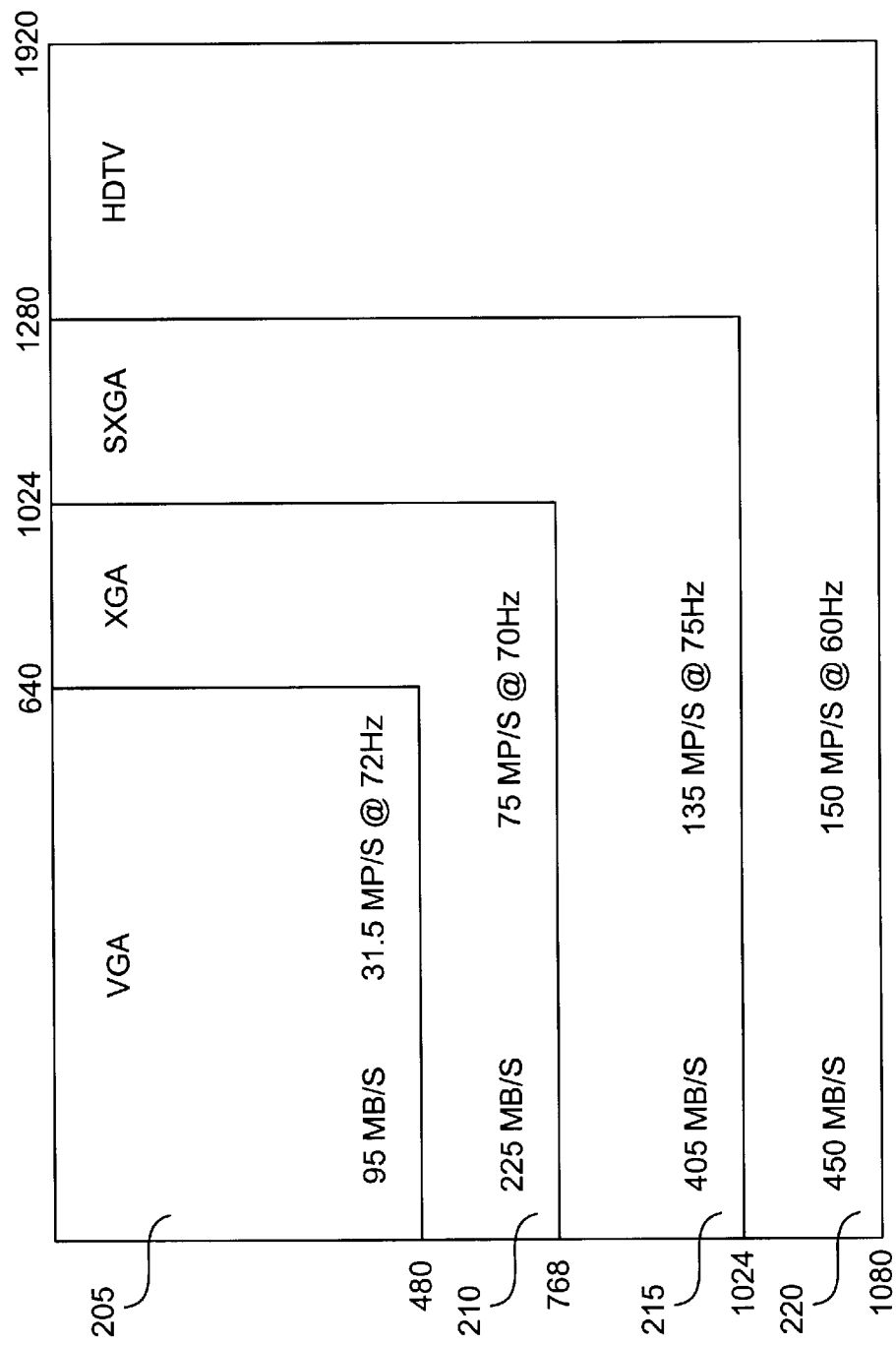
FIG. 2 is a representation of screen resolutions and typical data throughput requirements.

The present invention provides methods and apparatus for implementing a pixel page system providing pixel pages optimized for use with a GLV (grating light valve). As described above, a GLV projects an image using a horizontal scan (one column of pixels at a time, sweeping from left to right). Accordingly, it is advantageous to provide pixel data to a GLV according to vertical columns of pixels in a frame. Different pixel page geometries provide more desirable results, such as fewer page misses, when used in a system providing pixel data to a GLV. A pixel page geometry selected because the pixel page system will provide pixel data to a GLV is referred to herein as being optimized for use with a GLV.

As described in the related U.S. application Ser. No. 10/051,538 (filed Jan. 16, 2002), a pixel page is a two-dimensional array of pixels. A pixel page maps pixel data to memory locations for a region of pixels from multiple rows and columns of pixels in a frame. The memory locations within a memory device corresponding to one pixel page are in the same physical memory page. Pixel data is stored according to horizontal rows of pixels and retrieved according to vertical columns of pixels.

A. Pixel Pages and Pixel Page Geometry

Pixel pages are used in a frame buffer for storing pixel data. Pixel data is supplied to the frame buffer according to the horizontal order of pixels in a frame, such as from left to right, top to bottom. Pixel data is provided by the frame buffer according to the vertical order of pixels in a frame, such as from top to bottom, left to right. Pixel pages are configured to support storing and retrieving pixel data in these two different orders. In an alternative implementation, pixel data is supplied to the frame buffer according to vertical columns of pixels and provided by the frame buffer according to horizontal rows of pixels.

Each pixel page is a two-dimensional mapping of pixels and pixel data to memory locations, aligning rows and columns within the pixel page with rows and columns in the frame of pixels. One dimension of the pixel page, referred to as pixel page rows, corresponds to horizontal rows of pixels in the frame, referred to as frame rows. A second dimension of the pixel page, referred to as pixel page columns, corresponds to vertical columns of pixels in the frame, referred to as frame columns. A pixel page has multiple pixel page rows and multiple pixel page columns. Each pixel page indicates memory locations from a single physical memory page so that consecutive accesses to locations from a single pixel page do not cause page misses. Accordingly, accessing consecutive locations corresponding to a pixel page along a pixel page row or along a pixel page column does not cause page misses. Page misses can occur at the end of a pixel page row or pixel page column in making a transition to another pixel page. By storing pixel data along pixel page rows and retrieving data along pixel page columns, page misses can be reduced in processing pixel data that is to be stored in one order and retrieved in another order.

FIG. 7 is a representation of a frame 705 of pixels 710. Frame 705 has 16 frame columns and 16 frame rows (16×16; 256 pixels) for simplicity, but other resolutions are possible. For example, as noted above, a frame in one typical HD resolution is 1920×1080 (2,073,600 pixels). Pixels 710 in frame 705 are sequentially numbered from 0 to 255. Frame 705 is divided into pixel pages 715, outlined in heavier lines. Pixel pages 715 have a pixel page geometry of 4×4. Each pixel page 715 includes 16 pixels 710, in four pixel page columns 720 and four pixel page rows 725. Accordingly, a pixel page column 720 includes four pixels 710, and a pixel page row 725 includes four pixels 710. For example, pixels 0, 16, 32, and 48 are in one pixel page column 720 and pixels 0, 1, 2, and 3 are in one pixel page row 725. Frame 705 has 16 pixel pages 715, four horizontally by four vertically. Pixel data for each pixel page 715 is stored in a respective page of physical memory. For frame 705, the first page of memory stores pixel data for the pixel page 715 including pixels 0, 1, 2, 3, 16, 17, 18, 19, 32, 33, 34, 35, 48, 49, 50, and 51. The second page of memory stores pixel data for the pixel page 715 including pixels 4, 5, 6, 7, 20, 21, 22, 23, 36, 37, 38, 39, 52, 53, 54, 55, and so on.

In storing pixel data for frame 705, pixel data is stored for pixels 710 in horizontal row order (left to right, top to bottom): 0, 1, 2, 3, 4, and so on. Pixel data is stored following the pixel page rows 725 of pixel pages 715 (e.g., horizontally). A page miss occurs at the boundary of each pixel page 715, at the end of a pixel page row 725 (as described below, some page misses can be hidden using burst accessing, depending on the type of memory device). Because pixel pages 715 are four pixels 710 wide, a page miss would occur storing pixel data for every four pixels 710, i.e., storing pixel data for pixel 0, for pixel 4, pixel 8, etc. Storing one frame 705 of pixel data would cause a total of 64 page misses (4*16).

In retrieving pixel data for frame 705, pixel data is retrieved for pixels 710 in vertical column order (top to bottom, left to right): 0, 16, 32, 48, 64, and so on. Pixel data is retrieved following the pixel page columns 720 of the pixel pages 715 (e.g., vertically). A page miss occurs at the end of each pixel page column 720. Because pixel pages 715 are four pixels 710 tall, a boundary of a pixel page 715 occurs vertically every four pixels 710. Accordingly, a page miss would occur retrieving pixel data for every four pixels 710, i.e., retrieving pixel data for pixel 0, for pixel 64, for pixel 128, etc. Retrieving one frame 705 of pixel data would cause a total of 64 page misses (4*16).

The total page misses in processing one frame 705 using pixel pages 715 would be 128. By comparison, if pixel data were stored corresponding to horizontal frame rows of pixels, i.e., pixel data for 0 through 15 were stored in the same memory page, a page miss would occur every 16 pixels for storing pixel data and every pixel for retrieving pixel data. Storing one frame would cause 16 page misses (1*16) and retrieving one frame would case 256 page misses (16*16). The total page misses in processing one frame would be 272. Accordingly, pixel pages can provide a significant speed improvement without changing the physical memory device.

Figure 8:
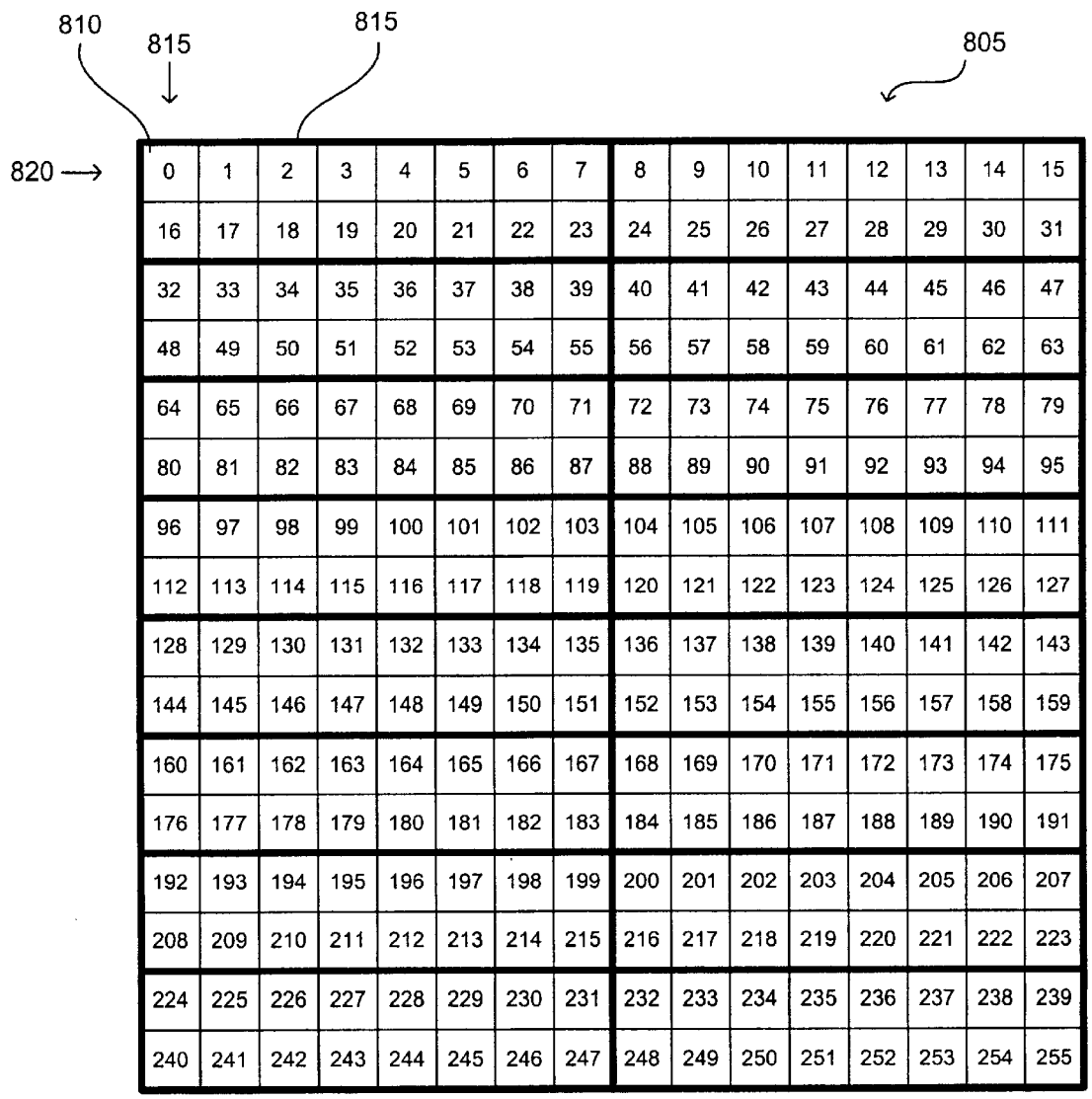
FIG. 8 is a representation of a frame of pixels according to the present invention.

FIG. 8 is a representation of a frame 805 of pixels 810. Similar to FIG. 7, frame 805 has 16 frame columns and 16 frame rows (16×16; 256 pixels). Frame 805 is divided into 16 pixel pages 815, outlined in heavier lines. Each pixel page 815 includes 16 pixels 810 and has a pixel page geometry of 8×2, eight pixel page columns 820 and two pixel page rows 825. Accordingly, a pixel page column 820 includes two pixels 810, and a pixel page row 825 includes eight pixels 810. In storing pixel data for frame 805, because pixel pages 815 are eight pixels 810 wide, a page miss would occur storing pixel data for every eight pixels 810. Storing one frame 805 of pixel data would cause a total of 32 page misses (2*16). In retrieving pixel data for frame 805, because pixel pages 815 are two pixels 810 tall, a page miss would occur retrieving pixel data for every two pixels 810. Retrieving one frame 805 of pixel data would cause a total of 128 page misses (8*16). In total, storing and retrieving one frame 805 of pixels using pixel pages 815 would cause 160 page misses.

Figure 9:
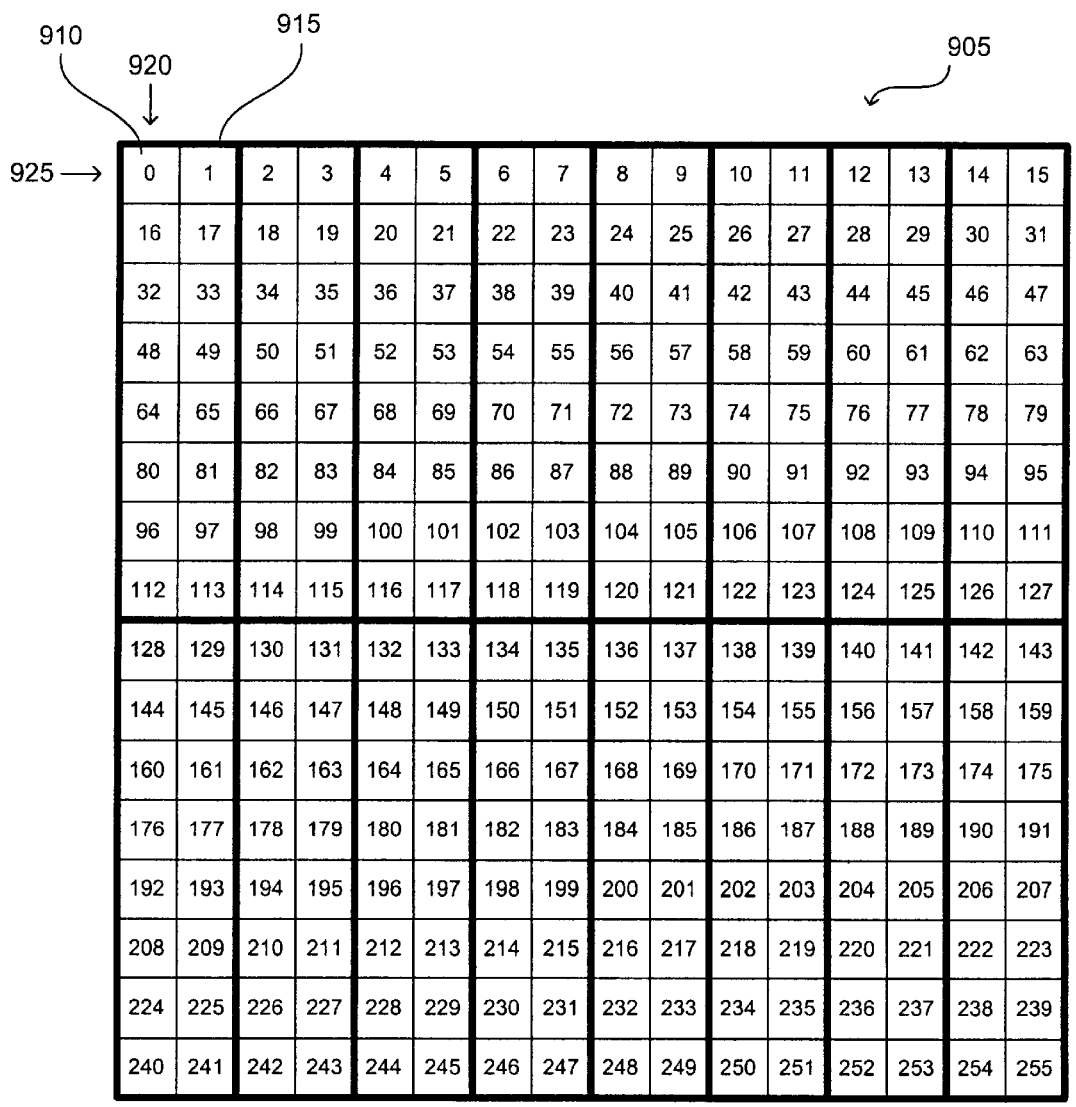
FIG. 9 is a representation of a frame of pixels according to the present invention.

FIG. 9 is a representation of a frame 905 of pixels 910. Similar to FIG. 7, frame 905 has 16 frame columns and 16 frame rows (16×16; 256 pixels). Frame 905 is divided into 16 pixel pages 915, outlined in heavier lines. Each pixel page 915 includes 16 pixels 910 and has a pixel page geometry of 2×8, two pixel page columns 920 and eight pixel page rows 925. Accordingly, a pixel page column 920 includes eight pixels 910, and a pixel page row 925 includes two pixels 910. In storing pixel data for frame 905, because pixel pages 915 are two pixels 910 wide, a page miss would occur storing pixel data for every two pixels 910. Storing one frame 905 of pixel data would cause a total of 128 page misses (8*16). In retrieving pixel data for frame 905, because pixel pages 915 are eight pixels 910 tall, a page miss would occur retrieving pixel data for every eight pixels 910. Retrieving one frame 905 of pixel data would cause a total of 32 page misses (2*16). In total, storing and retrieving one frame 905 of pixels using pixel pages 915 would cause 160 page misses.

The examples in FIGS. 7, 8, and 9 illustrate that a symmetrical pixel page geometry can be useful for reducing page misses. In particular, a symmetrical pixel page geometry reduces page misses when the screen resolution is also symmetrical. While HD resolution 1920×1080 is not symmetrical, a symmetrical pixel page geometry can be useful for reducing page misses in HD resolution as well. To conserve memory space, a pixel page geometry that uses all the locations in the corresponding page of memory is also useful. In an implementation where a memory page has 256 locations, a pixel page geometry of 16×16 or 8×32 includes 256 pixels and so can use all the locations in each memory page.

FIG. 10 is a representation of one implementation of a pixel page 1005 of pixels 1010 in an HD resolution implementation. Pixel page 1005 has a pixel page geometry of 16×16. Pixels 1010 in pixel page 1005 are numbered as the pixels 1010 would be numbered in the corresponding 1920×1080 frame for the first pixel page 1005. Pixel page 1005 includes 256 pixels 1010, in 16 pixel page columns 1015 (numbered 0 to 15) and 16 pixel page rows 1020 (numbered 0 to 15). A pixel page column 1015 includes 16 pixels 1010 and a pixel page row 1020 includes 16 pixels 1010. For clarity, not every pixel 1010 of pixel page 1005 is shown in FIG. 10. Ellipses indicate intervening pixels 1010.

In storing pixel data for a 1920×1080 frame, because pixel pages 1005 are 16 pixels 1010 wide, a page miss would occur storing pixel data for every 16 pixels 1010. Storing one 1920×1080 frame of pixel data would cause a total of 129,600 page misses (120*1080). In retrieving pixel data for a 1920×1080 frame, because pixel pages 1005 are 16 pixels 1010 tall, a page miss would occur retrieving pixel data for every 16 pixels 1010. Retrieving one 1920×1080 frame of pixel data would cause a total of 130,560 page misses (68*1920). In total, storing and retrieving one 1920×1080 frame of pixels using pixel pages 1005 would cause 260,160 page misses.

FIG. 11 is a representation of one implementation of a pixel page 1105 of pixels 1110 in an HD resolution implementation. Pixel page 1105 has a pixel page geometry of 8×32. Pixels 1110 in pixel page 1105 are numbered as the pixels 1110 would be numbered in the corresponding 1920× 1080 frame for the first pixel page 1105. Pixel page 1105 includes 256 pixels 1110, in 8 pixel page columns 1115 (numbered 0 to 7) and 32 pixel page rows 1120 (numbered 0 to 31). A pixel page column 1115 includes 32 pixels 1110 and a pixel page row 1120 includes 8 pixels 1110. For clarity, not every pixel 1110 of pixel page 1105 is shown in FIG. 11. Ellipses indicate intervening pixels 1110.

In storing pixel data for a 1920×1080 frame, because pixel pages 1105 are 8 pixels 1110 wide, a page miss would occur storing pixel data for every 8 pixels 1110. Storing one 1920×1080 frame of pixel data would cause a total of 259,200 page misses (240*1080). In retrieving pixel data for a 1920×1080 frame, because pixel pages 1105 are 32 pixels 1110 tall, a page miss would occur retrieving pixel data for every 32 pixels 1110. Retrieving one 1920×1080 frame of pixel data would cause a total of 65,280 page misses (34*1920). In total, storing and retrieving one 1920×1080 frame of pixels using pixel pages 1105 would cause 324,480 page misses.

In one implementation, burst accessing or a burst mode is used to access a sequence of memory locations in a memory page. Burst accessing is a well known technique and is described more fully in related U.S. application Ser. No. 10/051,538, filed Jan. 16, 2002. Burst accessing can be used to hide page misses by activating a memory page in a second memory bank while a burst access is being made to a memory page in a first memory bank. Similarly, activating a memory page in the first bank while a burst access is being made to a memory page in the second bank can hide page misses. A cycle of banks can be used for a memory device including more than two memory banks (e.g., activate a page in a third bank while burst accessing in the second bank, and so on looping back to the first bank). Pixel pages correspond to memory pages following this pattern. For example, in one implementation using a memory device having four memory banks, the first pixel page in a frame corresponds to the first memory page in a first bank, the second pixel page corresponds to the first memory page in a second bank, the third pixel page corresponds to the first memory page in a third bank, the fourth pixel page corresponds to the first memory page in a fourth bank, the fifth pixel page corresponds to the second memory page in the first bank, and so on. This pattern continues throughout the frame so that the next memory page to be accessed is in a different bank from the currently accessed memory page.

In one implementation, pixel data for adjacent pixel pages, vertically and horizontally, is stored in different banks. For example, referring to FIG. 7, the horizontally and vertically first pixel page (i.e., the pixel page including pixel 0) corresponds to the first bank. The horizontally second pixel page (i.e., the pixel page including pixel 4) corresponds to the second bank. The vertically second pixel page (i.e., the pixel page including pixel 64) corresponds to the second bank. This pattern continues throughout the frame so that the next memory page to be accessed, while storing or retrieving pixel data, is in a different bank from the currently accessed memory page.

By using burst accessing with pixel pages, page misses can be hidden while storing pixel data. Referring to FIG. 11, using burst accessing with pixel pages 1105, in storing pixel data for a 1920×1080 frame, because pixel pages 1105 are 8 pixels 1110 wide, the end of a pixel page 1105 occurs every 8 pixels 1110 horizontally. Using burst accessing and multiple memory banks, the page miss that would occur at the boundary of each pixel page can be hidden while storing pixel data. Accordingly, storing one 1920×1080 frame of pixel data would cause one effective page miss (i.e., a page miss that affects timing and is not hidden) in activating the first memory page. Storing pixel data for a sequence of frames would cause only one effective page miss at the start of the first frame. When using burst accessing the horizontal dimension of the pixel page geometry does not affect the number of effective page misses, so long as the pixel page is wide enough to allow burst accessing to be effective. Typically eight cycles is sufficient and so a pixel page width of eight is desirable.

However, typical burst accessing would not help to hide page misses in retrieving pixel data (according to vertical column order) using pixel pages because the sequences of addresses generated using burst accessing are typically consecutive or tightly grouped. Conversely, the addresses needed for retrieving pixel data using pixel pages are not consecutive and may be spaced widely (e.g., 0, 8, 16, etc.) and so typical burst accessing is not applicable. Instead, increasing the pixel page height can reduce the number of page misses while retrieving pixel data, reducing the time lost to page misses. In retrieving pixel data for a 1920×1080 frame, because pixel pages 1105 are 32 pixels 1110 tall, a page miss would occur retrieving pixel data for every 32 pixels 1110. Retrieving one 1920×1080 frame of pixel data would cause a total of 65,280 page misses (34*1920). In total, storing and retrieving one 1920×1080 frame of pixels using pixel pages 1105 and burst accessing would cause 65,281 effective page misses. By comparison, using pixel page 1005 in FIG. 10 that have a pixel page geometry of 16×16 would cause more effective page misses. While storing pixel data would cause one effective page miss, retrieving pixel data would cause 130,560 page misses (68*1920). In total, storing and retrieving one 1920—1080 frame of pixels using pixel pages 1005 and burst accessing would cause 130,561 effective page misses. Accordingly, when using burst accessing for storing pixel data according to horizontal rows, a pixel page geometry that maximizes the number of pixels along the vertical dimension while having enough pixels horizontally to effectively use burst accessing is desirable. One pixel page geometry optimized for use with a GLV and burst accessing while storing data is 8×32. In an alternative implementation, pixel data is stored and retrieved to take advantage of burst accessing while retrieving pixel data. In this case, a pixel page geometry that maximizes the number of pixels along the horizontal dimension while having enough pixels vertically to effectively use burst accessing is desirable. One pixel page geometry optimized for use with a GLV and burst accessing while retrieving data is 32×8.

B. Video Data System Using Pixel Pages

Figure 12:
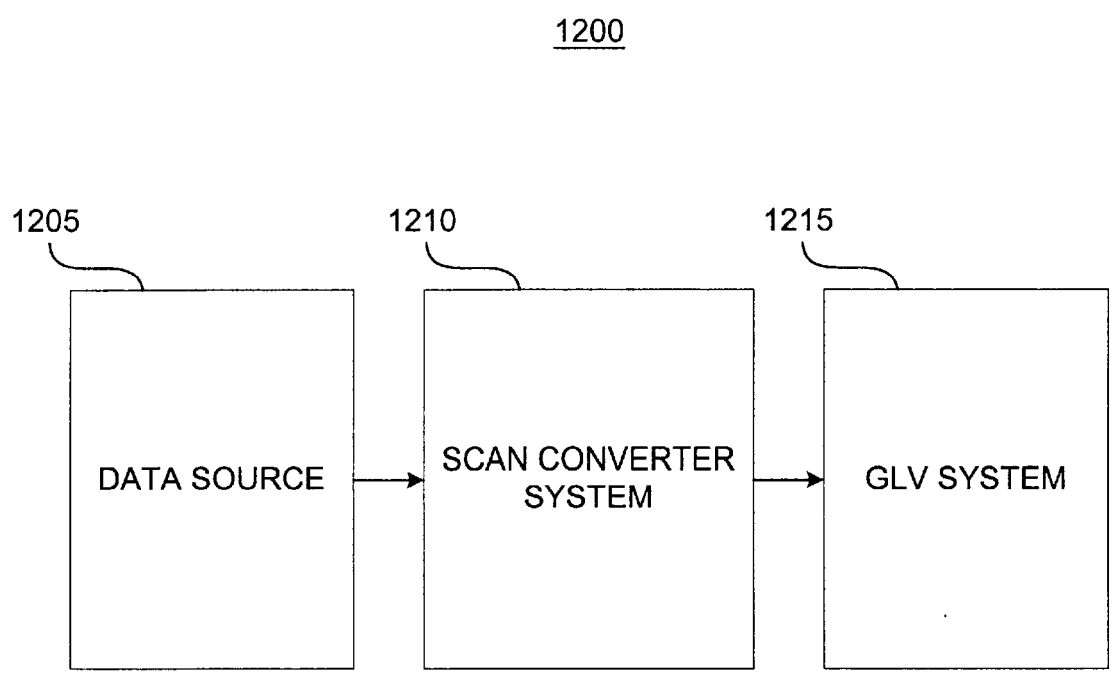
FIG. 12 is a block diagram of a video data system according to the present invention.

FIG. 12 is a block diagram of a video data system 1200. A data source 1205 provides video data for frames of pixels to a scan converter system 1210 in a first order. Scan converter system 1210 stores the data using pixel pages, as described above. Scan converter system 1210 retrieves the data in a second order and provides the retrieved data to a GLV system 1215. For a video application, scan converter system 1210 can be used as a type of scan converter between data source 1205 and GLV system 1215.

Data source 1205 is a video source providing pixel data to scan converter system 1210 and GLV system 1215 is a display system using one or more GLV's. Data source 1205 provides pixel data according to horizontal rows of pixels and GLV system 1215 receives pixel data according to vertical columns of pixels, as described above. Scan converter system 1210 provides the conversion.

Data source 1205 can be implemented to provide pixel data according to various screen resolutions, such as an HD resolution of 1920×1080. While the discussion herein focuses on this HD resolution, alternative implementations can accommodate other resolutions. For an HD resolution signal, data source 1205 provides pixel data for a progressive signal (e.g., 1920×1080p). Data source 1205 can be implemented to receive an interlaced signal (e.g., 1920× 1080i) and provide a progressive signal, such as by merging interlaced fields using a de-interlacer. In an alternative implementation, data source 1205 provides an interlaced signal, providing pixel data for half the screen pixels (i.e., first field) and then pixel data for the other half (i.e., second field). In another implementation, data source 1205 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 1205 provides pixel data at 1920×1080p and 32 bits per pixel, the pixel rate is approximately 150 MP/S and the data rate from data source 1205 is approximately 600 MB/S. Accordingly, scan converter system 1210 stores pixel data from data source 1205 at a data rate of approximately 600 MB/S. To provide pixel data at a rate to support the same resolution, 1920×1080p, scan converter system 1210 outputs pixel data to GLV system 1215 at a data rate of approximately 600 MB/S.

GLV system 1215 can be a color GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 12). Accordingly, it is advantageous for the GLV system to receive pixel data according to vertical columns of pixels, rather than horizontal rows. Scan converter system 1210 provides the pixel data to the GLV system corresponding to vertical columns of pixels.

C. Pixel Page System Using Two Memory Devices

An HD implementation (1920×1080 screen resolution) of a pixel page system using pixel pages optimized for use with a GLV is described below. This implementation is illustrative of the operation of one system and alternative implementations are possible. The operation of this system is similar to the pixel page systems described in U.S. application Ser. No. 10/051,538 (filed Jan. 16, 2002), except that the pixel page geometry is optimized for use with a GLV. Altering the pixel page geometry may affect the generation of addresses for storing and retrieving pixel data.

Figure 4:
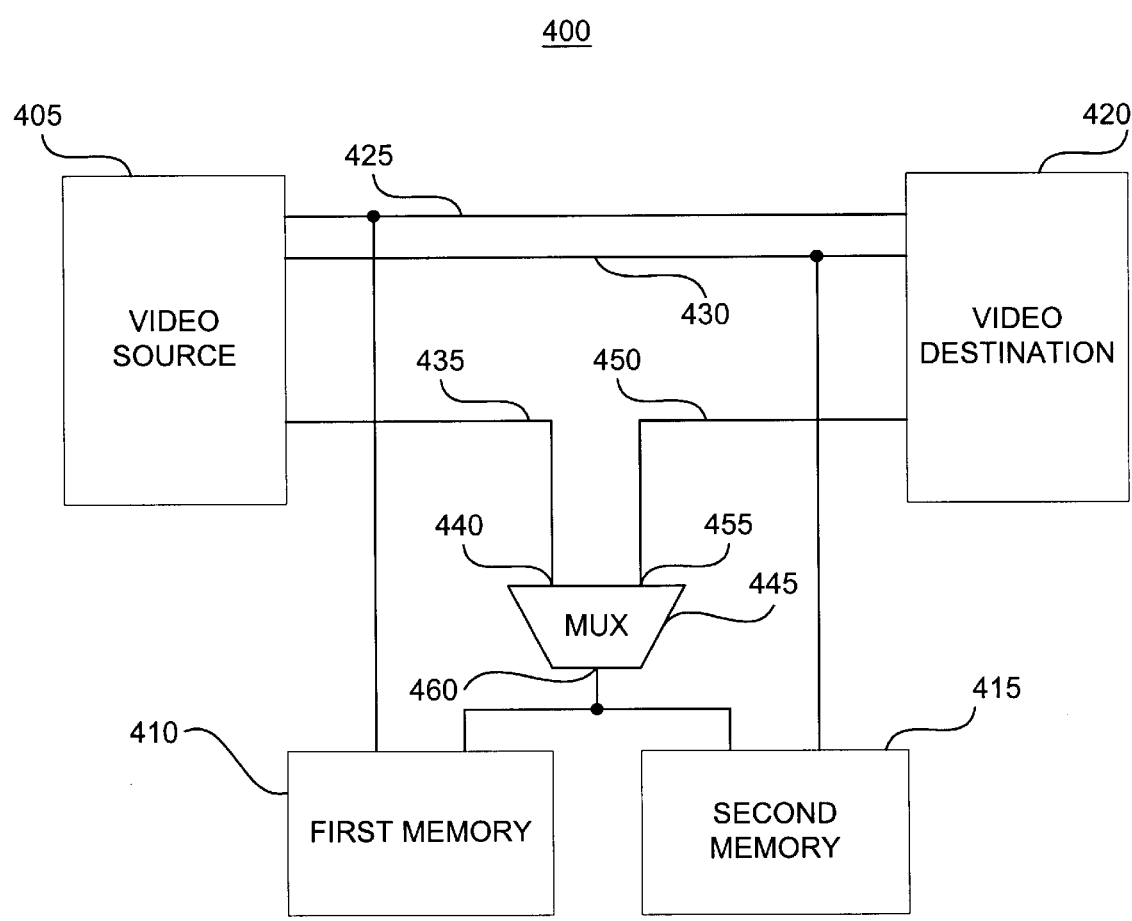
FIG. 4 is a block diagram of a typical frame buffer architecture capable of accessing pixel data for two pixels in parallel.
Figure 5:
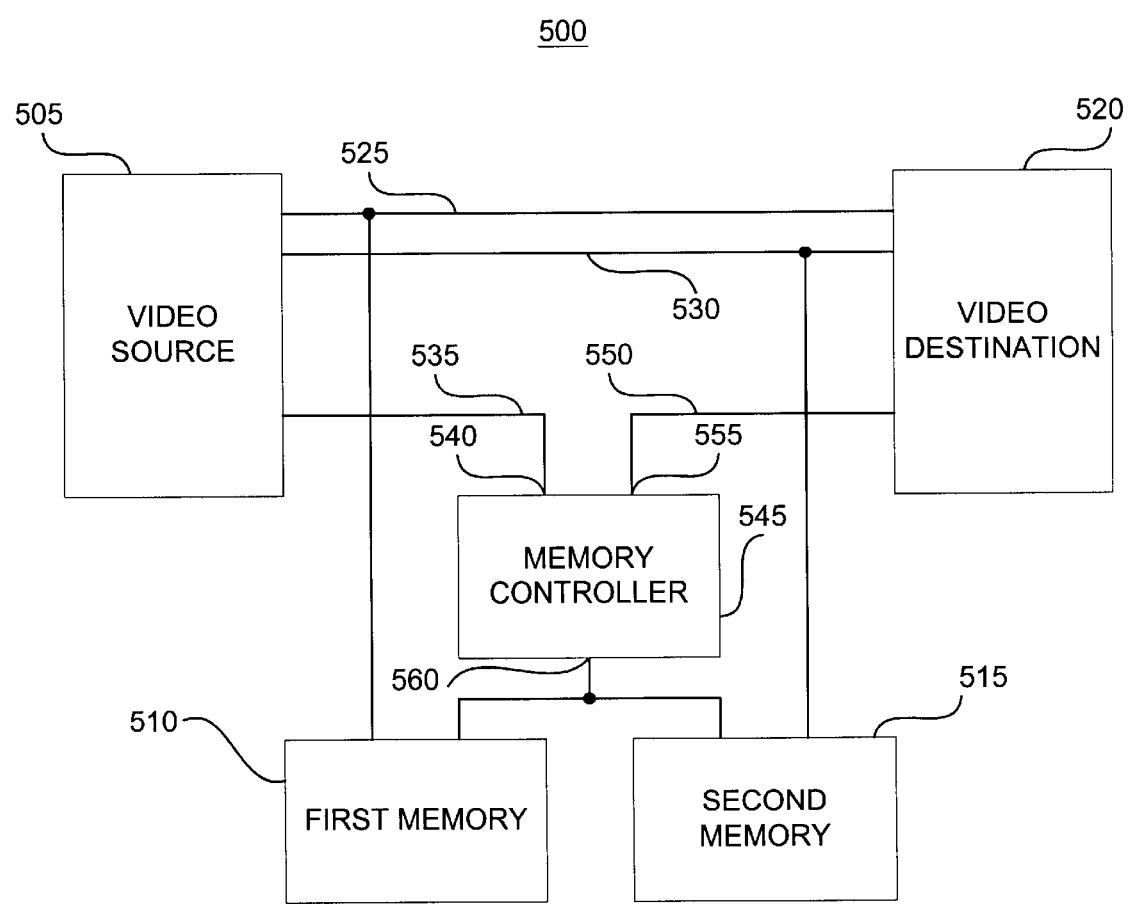
FIG. 5 is a block diagram of another implementation of a dual pixel frame buffer architecture.
Figure 13:
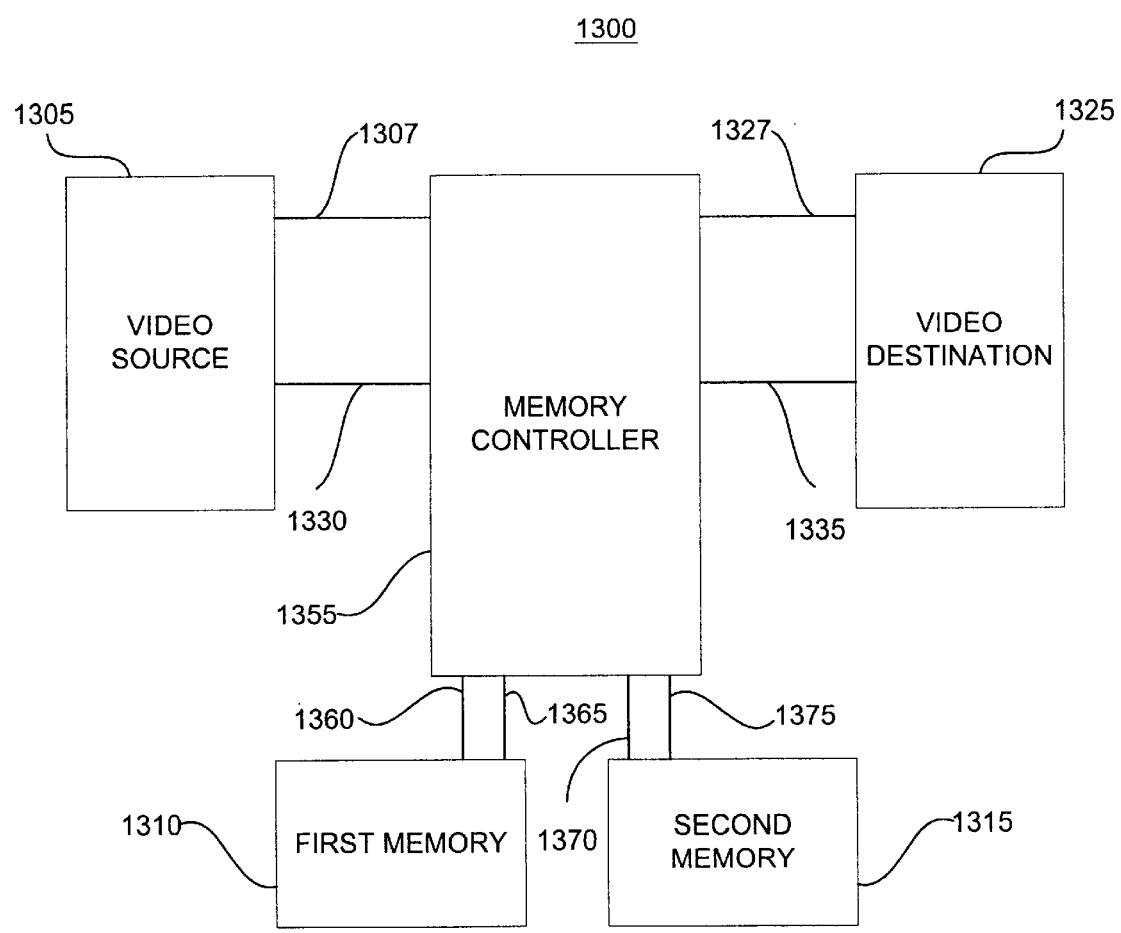
FIG. 13 is a block diagram of a frame buffer architecture according to the present invention.

FIG. 13 is a block diagram of a frame buffer architecture 1300. Architecture 1300 is similar to architectures 400 and 500 in FIGS. 4 and 5, respectively, however, architecture 1300 includes a memory controller 1355 centrally interconnecting video source 1305, video destination 1325, first memory 1310 and second memory 1315.

In addition, while memories 1310 and 1315 are used in parallel, pixel data is stored to one memory while pixel data is retrieved from the other memory, as described below. Pixel data can be stored in one memory device and, during the same clock cycle, pixel data can be retrieved from the other memory device. The memory devices switch roles with each frame. This pattern of alternately storing and retrieving is referred to herein as memory alternation. For example, a first frame of pixel data is stored, one pixel at a time, in first memory 1310, as described below. A second frame of pixel data is then stored, one pixel at a time, in second memory 1315. While the second frame is being stored, the first frame of pixel data is retrieved from first memory 1310, one pixel at a time, as described below. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory devices switch roles. The third frame of pixel data is stored in first memory 1310, while the second frame of pixel data is retrieved from second memory 1315. Memory alternation continues as long as frames are supplied to video source 1305.

A video source 1305 provides pixel data to memory controller 1355 and a video destination 1325 retrieves pixel data from memory controller 1355. Using memory alternation, memory controller 1355 stores and retrieves pixel data to and from memories 1310, 1315. First memory 1310 and second memory 1315 are separate memory devices, such as two 32-bit wide 8 MB SDRAM's (e.g., 2M×32 SDRAM MT48LC2M32B2 by Micron Technology, Inc.). The SDRAM is preferably fast enough to support the data rate needed for the screen resolution, such as 150 MHz or 166 MHz. Other types of memory can also be used, such as SGRAM (synchronous graphics RAM).

Video source 1305 receives video data from another source (not shown), such as a broadcast source or a software application running on a computer system connected to video source 1305. Video source 1305 outputs pixel data for one pixel at a time on first data bus 1307.

Video destination 1325 provides pixel data to a GLV system (not shown in FIG. 13), such as GLV system 1215 in FIG. 12. Video destination 1325 receives pixel data for one pixel at a time on a second data bus 1327. In one implementation, video source 1305 and video destination 1325 include FIFO buffers, such as to avoid buffer overrun or underrun. In another implementation, these FIFO buffers are included in memory controller 1355.

First data bus 1307 is connected to video source 1305 and memory controller 1355. Second data bus 1327 is connected to video destination 1325 and memory controller 1355. Memory controller 1355 receives signals from video source 1305 and video destination 1325 through control lines 1330 and 1335, respectively, for addressing (e.g., indicating whether pixel data is to be stored to or retrieved from memories 1310 and 1315), or that horizontal and vertical synchronization signals have been received (e.g., to indicate the end of a frame row of pixels or the end of a frame, respectively). A first memory data bus 1360 and a first memory address bus 1365 are connected to memory controller 1355 and first memory 1310. A second memory data bus 1370 and a second memory address bus 1375 are connected to memory controller 1355 and second memory 1315. First memory 1310 and second memory 1315 also receive control signals (not shown) from memory controller 1355 to control whether memories 1310 and 1315 will read in data (write mode) or read out data (read mode). In addition, while clock lines are not shown in FIG. 13, architecture 1300 operates based on clock cycles so that pixel data can be processed for two pixels per clock cycle in support of the desired pixel rate.

Memory controller 1355 controls routing pixel data from video source 1305 to memories 1310 and 1315 and routing pixel data from memories 1310 and 1315 to video destination 1325. Memory controller 1355 controls the operation of memories 1310 and 1315, such as the read or write state, and also generates addresses for storing pixel data to and retrieving data from memories 1310 and 1315, as described below. In an alternative implementation, separate address generators for storing and retrieving data provide addresses to memory controller 1355. In another alternative implementation, a separate memory controller is provided for and connected to each memory and generates addresses for the connected memory.

Memory controller 1355 operates to provide the mapping of pixel pages from pixels to memory locations and to control the alternation between storing and retrieving data for memories 1310 and 1315. In aspects other than pixel pages and alternation of storing and retrieving, such as generating addresses, architecture 1300 operates similarly to dual pixel architectures 400 and 500, as described above. In alternative implementations, an architecture structurally similar to architecture 400 or architecture 500 can be used (e.g., an architecture including address multiplexors and having address generation controlled by video source and video destination), with modifications as described below.

Memory controller 1355 has two states: (A) connecting first data bus 1307 to first memory 1310, and second data bus 1327 to second memory 1315; and (B) connecting first data bus 1307 to second memory 1315, and second data bus 1327 to first memory 1310. Accordingly, in state A while first memory data bus 1360 is providing pixel data to be stored to first memory 1310, second memory data bus 1370 is providing pixel data retrieved from second memory 1315. Conversely, in state B while first memory data bus 1360 is providing pixel data retrieved from first memory 1310, second memory data bus 1370 is providing pixel data to be stored to second memory 1315. The memory that memory controller 1355 currently uses for storing pixel data is referred to herein as the store memory, and the memory that memory controller 1355 currently uses for retrieving pixel data is referred to herein as the retrieve memory. Memory controller 1355 receives a control signal to switch between states, such as from video source 1305 on control line 1330. Video source 1305 toggles the control signal after completing storing pixel data for a frame. In one implementation, memory controller 1355 is connected to a flip-flop that is triggered by a vertical synchronization signal supplied by video source 1305.

Figure 14:
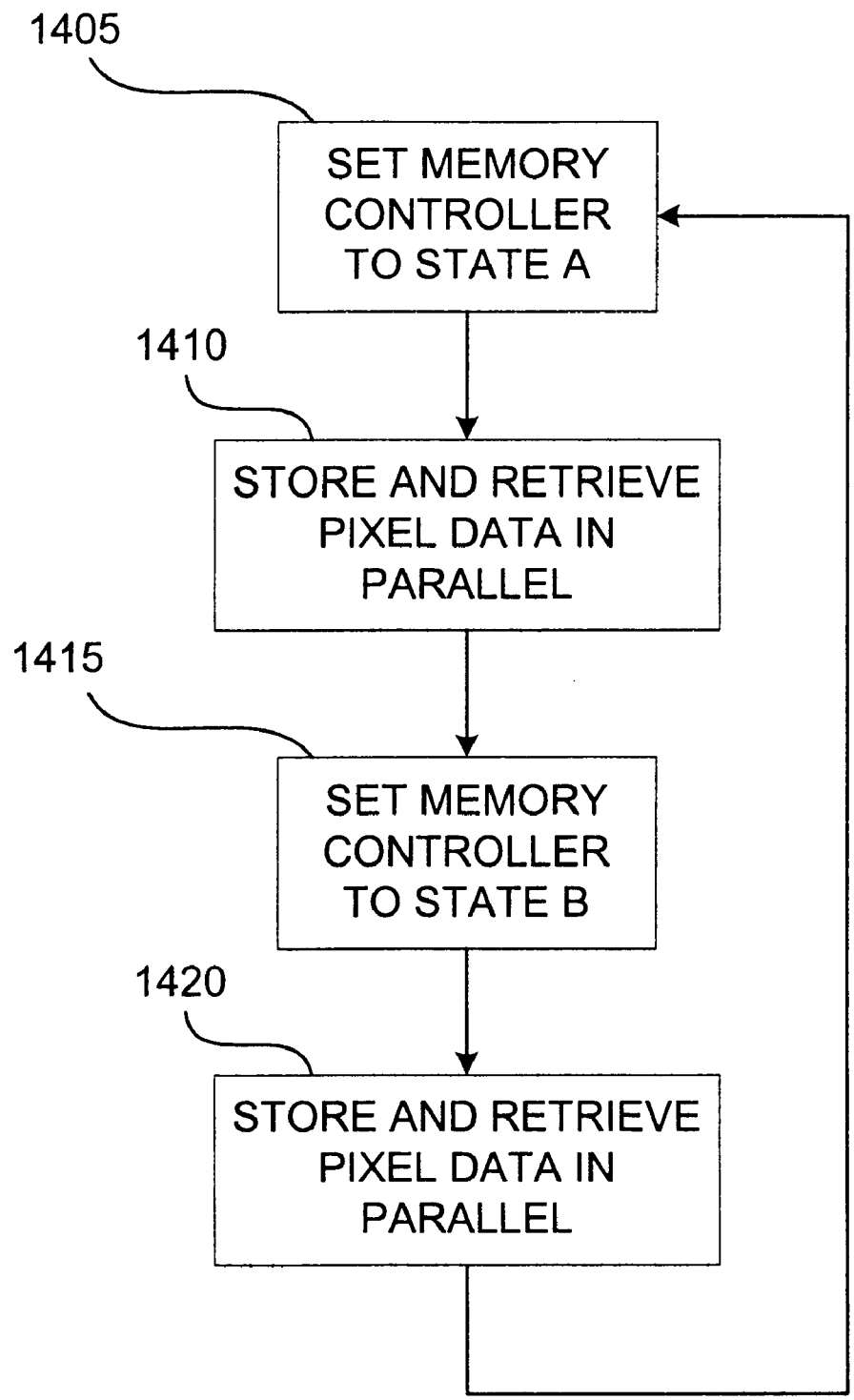
FIG. 14 is a flowchart of storing and retrieving pixel data in parallel using memory alternation according to the present invention.

FIG. 14 is a flowchart of storing and retrieving pixel data in parallel using memory alternation, such as in architecture 1300 of FIG. 13. When a first frame of pixel data becomes available to video source 1305, video source 1305 sets memory controller 1355 to state A (pixel data to be stored to first memory 1310, pixel data to be retrieved from second memory 1315), block 1405. Memory controller 1355 stores the first frame of pixel data, one pixel at a time, in first memory 1310, as described below, and memory controller 1355 retrieves pixel data from second memory 1315, as described below, block 1410. Initially, pixel data has not been stored in second memory 1315, and so pixel data retrieved during the first loop may not produce a desirable image. After a frame of pixel data has been stored, video source 1305 sets memory controller 1355 to state B (pixel data to be retrieved from first memory 1310, pixel data to be stored to second memory 1315), block 1415. Memory controller 1355 stores a frame of pixel data and retrieves pixel data for another frame according to the state of memory controller 1355, block 1420. After a frame of pixel data has been stored, video source 1305 returns to block 1405 and sets memory controller 1355 to state A. When a new frame is not available to video source 1305, storing and retrieving pixel data is complete. When a new frame later becomes available, video source 1305 begins at block 1405 again.

The rates at which pixel data is stored and retrieved are different in some implementations. For example, referring to FIG. 13, in one implementation, memory controller 1355 retrieves pixel data for one pixel every clock cycle and stores pixel data for one pixel every other clock cycle. In this case, memory controller 1355 causes a frame to be displayed twice. Memory controller 1355 retrieves pixel data for an entire frame in the same time that video source 1305 has provided half of the pixel data for a new frame. Memory controller 1355 then retrieves pixel data for the same frame again while video source 1305 provides pixel data for the second half of the new frame. In one implementation having a higher output data rate than the input data rate, pixel data is stored and retrieved to use burst accessing while retrieving pixel data. In this case, burst accessing can advantageously hide page misses while pixel data for a frame is retrieved two or more times as often as pixel data for a single frame is stored.

The pixel page geometry affects the allocation of pixel pages for each frame of pixels. The allocation of pixel pages controls the allocation of memory. As described above, an HD resolution frame has 2,073,600 pixels, in 1920 frame columns and 1080 frame rows. One implementation uses pixel pages having a pixel page geometry of 8×32, such as pixel pages 1105 in FIG. 11. Each pixel page 1105 is 8 pixels 1110 wide, so one frame has at least 240 pixel pages 1105 horizontally. Each pixel page 1105 is 32 pixels 1110 tall, so one frame has at least 34 pixel pages 1105 vertically (though the pixel pages 1105 in the 34$^{th}$ row of pixel pages 1105 are not completely filled with valid screen pixels, where a "valid" screen pixel is a pixel in the frame for which pixel data has been provided from the video source). In total, one frame has at least 8160 pixel pages 1105 allocated, where each allocated pixel page has a corresponding memory page. In an HD resolution implementation, pixel data is stored and retrieved in similar sequences to those described above. Pixel data is stored along horizontal frame rows, such as this sequence of pixels: 0, 1, 2, 3, 4, and so on. Pixel data is retrieved along vertical frame columns, such as this sequence of pixels, 0, 1920, 3840, 5760, and so on. In addition, when using burst accessing, horizontally consecutive pixel pages correspond to memory pages in different banks in the memory device.

FIG. 15 is a table 1500 showing the relationships among a pixel, a frame row, a frame column, a pixel page, a pixel page row, a pixel page column, a memory page, a memory address, and a memory bank for an HD resolution implementation (1920×1080) using pixel pages 1105 in FIG. 11 and burst accessing. In FIG. 15, the pixel data for a frame is stored in one memory device, having 256 memory locations per memory page and four memory banks. In addition, FIG. 15 shows only a representative sample of pixels from a frame for clarity. As described above, an HD resolution frame has 2,073,600 pixels.

Column 1505 indicates the number of a pixel for which related information is shown in table 1500. Pixels in a frame are numbered from 0, left to right, top to bottom. For example, the first pixel in the frame is numbered 0, the last pixel of the first frame row is numbered 1919, and the first pixel of the second frame row is numbered 1920. Column 1510 indicates a frame row including the pixel in column 1505. Frame rows are numbered from 0, top to bottom. Column 1515 indicates a frame column including the pixel in column 1505. Frame columns are numbered from 0, left to right. Column 1520 indicates a pixel page including the pixel in column 1505. Pixel pages in a frame are numbered from 0, left to right, top to bottom. Column 1525 indicates a pixel page row including the pixel in column 1505. Pixel page rows are numbered from 0, from top to bottom within the pixel page including the pixel page row. Column 1530 indicates a pixel page column including the pixel in column 1505. Pixel page columns are numbered from 0, left to right within the pixel page including the pixel page column. Column 1535 indicates which memory bank stores pixel data for the pixel in column 1505. The four memory banks are numbered 0–3. Column 1540 indicates a memory page storing pixel data for the pixel in column 1505. Memory pages are numbered sequentially from 0 in each memory bank. Column 1545 indicates a memory address of a memory location storing pixel data for the pixel in column 1505. The memory address in column 1540 indicates a location within a memory page and each memory page starts from address 0. As described below referring to FIG. 17, in one implementation, the bank number, memory page number, and memory address can be combined into one address (e.g., the bank is indicated by the uppermost address bits, then the memory page, then the location or column within the page). In an HD resolution of 1920×1080, a 21-bit address is sufficient to address the 2,073,600 4-byte locations storing pixel data for the frame. XXX indicates an invalid screen pixel, frame row, or frame column. Invalid screen pixels, frame rows, and frame columns are outside the dimensions of the screen resolution (e.g., frame rows beyond 1079 in HD resolution 1920×1080). Memory locations are allocated for invalid screen pixels, frame rows, and frame columns in allocated pixel pages, but these memory locations are not used. For example, the first pixel of a frame is pixel 0, in frame row 0 and frame column 0, in pixel page row 0 and pixel page column 0 of pixel page 0, stored in memory bank 0, in memory page 0 at memory address 0. The second pixel of a frame (horizontally) is pixel 1, in frame row 0 and frame column 1, in pixel page row 0 and pixel page column 1 of pixel page 0, stored in memory bank 0, in memory page 0 at memory address 1.

Some pixel pages at the end of each column of pixel pages do not include valid screen pixels. 34 pixel pages are allocated vertically to the frame. Each pixel page is 32 pixels tall and so 34 pixel pages can include a column of 1088 pixels vertically. However, an HD resolution frame is only 1080 pixels tall and so has valid screen pixels for 33 pixel pages and 24 pixel page rows of a 34$^{th}$ pixel page, vertically. As a result, eight pixel page rows in each of the pixel pages in the 34$^{th}$ row of pixel pages (i.e., pixel pages 7920 through 8159) do not include valid screen pixels. For example, pixel 2073599 (i.e., the last pixel of the last frame row) is in pixel page row 23 of pixel page 8159 and pixel data for pixel 2073599 is stored in memory bank 3, in memory page 2039, at address 191. Pixel page rows 24 through 31 of pixel page 8159 do not include valid screen pixels. However, memory page 2039 includes 256 memory locations with addresses from 0 through 255. Addresses 192 through 255 are not used in memory page 2039 in memory bank 3. A similar situation occurs in each of the memory pages in each of the memory banks corresponding to the 34$^{th}$ row of pixel pages (i.e., memory pages 1980 through 2039 in memory banks 0 through 3).

Figure 16:
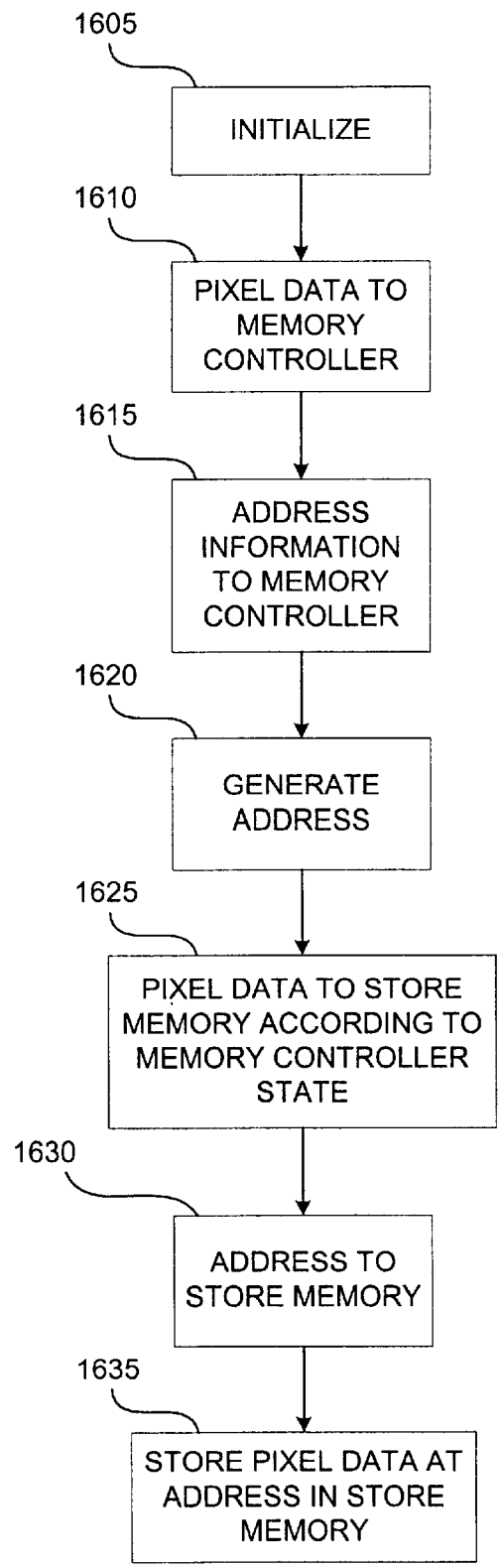
FIG. 16 is a flowchart of storing pixel data according to the present invention.

Memory controller 1355 stores pixel data according to horizontal rows of pixels. Memory controller 1355 generates source addresses to store pixel data for one pixel at a time, in parallel with retrieving pixel data for a different pixel, as described below. In an HD resolution implementation, memory controller 1355 stores pixel data for pixels in this sequence: 0, 1, 2, 3, 4, 5, and so on. Referring to FIG. 16, memory controller 1355 generates addresses in the following sequence (memory bank-memory page-memory address): 0-0-0, 0-0-1, . . . , 0-0-7, 1-0-0, 1-0-1, . . . , 3-0-7, 0-1-0, 0-1-1, . . . 3-59-7, 0-0-8, 0-0-9, and so on. As described above, pixel data for pixels in different pixel pages is stored in different memory pages.

FIG. 16 is a flowchart of storing pixel data using architecture 1300 in FIG. 13. To store pixel data, one of memories 1310, 1315 is the store memory according to the state of memory controller 1355 for memory alternation, as described above. Memory controller 1355 puts the store memory in write mode and memory controller 1355 is set to provide pixel data from video source 1305 to the store memory, block 1605. Video source 1305 provides pixel data for a first pixel to memory controller 1355 through data bus 1307, block 1610. Video source 1305 also provides address information to memory controller 1355 through control line 1330, block 1615. The address information indicates that memory controller 1355 is to store data to one of memories 1310, 1315, such as by indicating whether a frame has ended. Alternatively, video source 1305 provides the address information to memory controller 1355 once at the beginning of storage, such as at block 1605. Memory controller 1355 generates a source address, as described below, to store the pixel data, block 1620. In alternative implementations, video source 1305 can generate the addresses for storing pixel data and pass the addresses to memory controller 1355.

Memory controller 1355 passes the data from data bus 1307 to the store memory through the respective memory data bus (i.e., memory data bus 1360 for memory 1310 or memory data bus 1370 for memory 1315), block 1625. Memory controller 1355 provides the address to the store memory through the respective memory address bus (i.e., memory address bus 1365 for memory 1310 or memory address bus 1375 for memory 1315), block 1630. The store memory stores the pixel data on the connected memory data bus at the address on the connected memory address bus, block 1635. To store pixel data for the next pixel, video source 1305 returns to block 1610, or to block 1605 to restore the state of architecture 1300 for storage.

Figure 17:
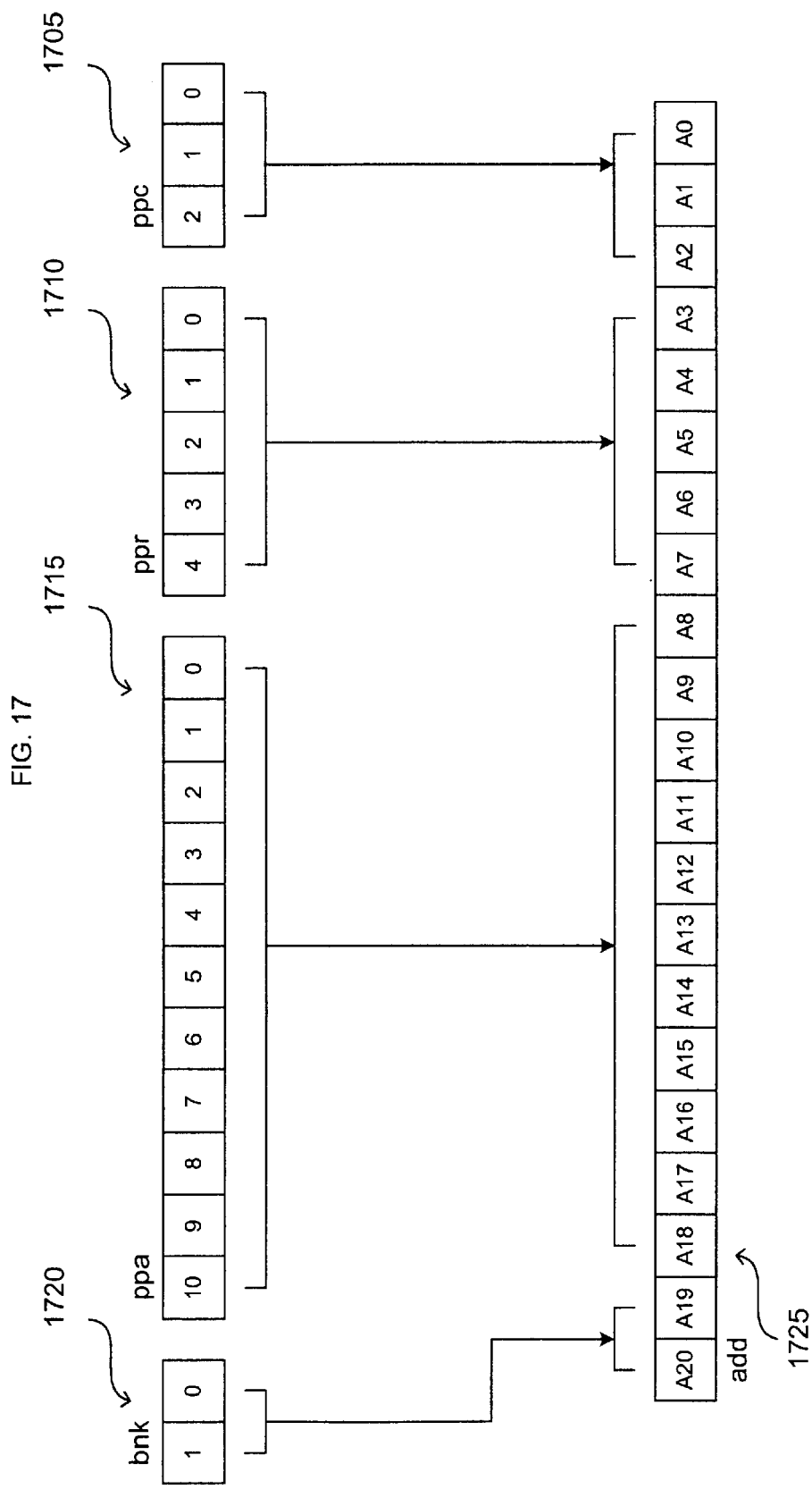
FIG. 17 illustrates generating an address from counter variables.
Figure 18:
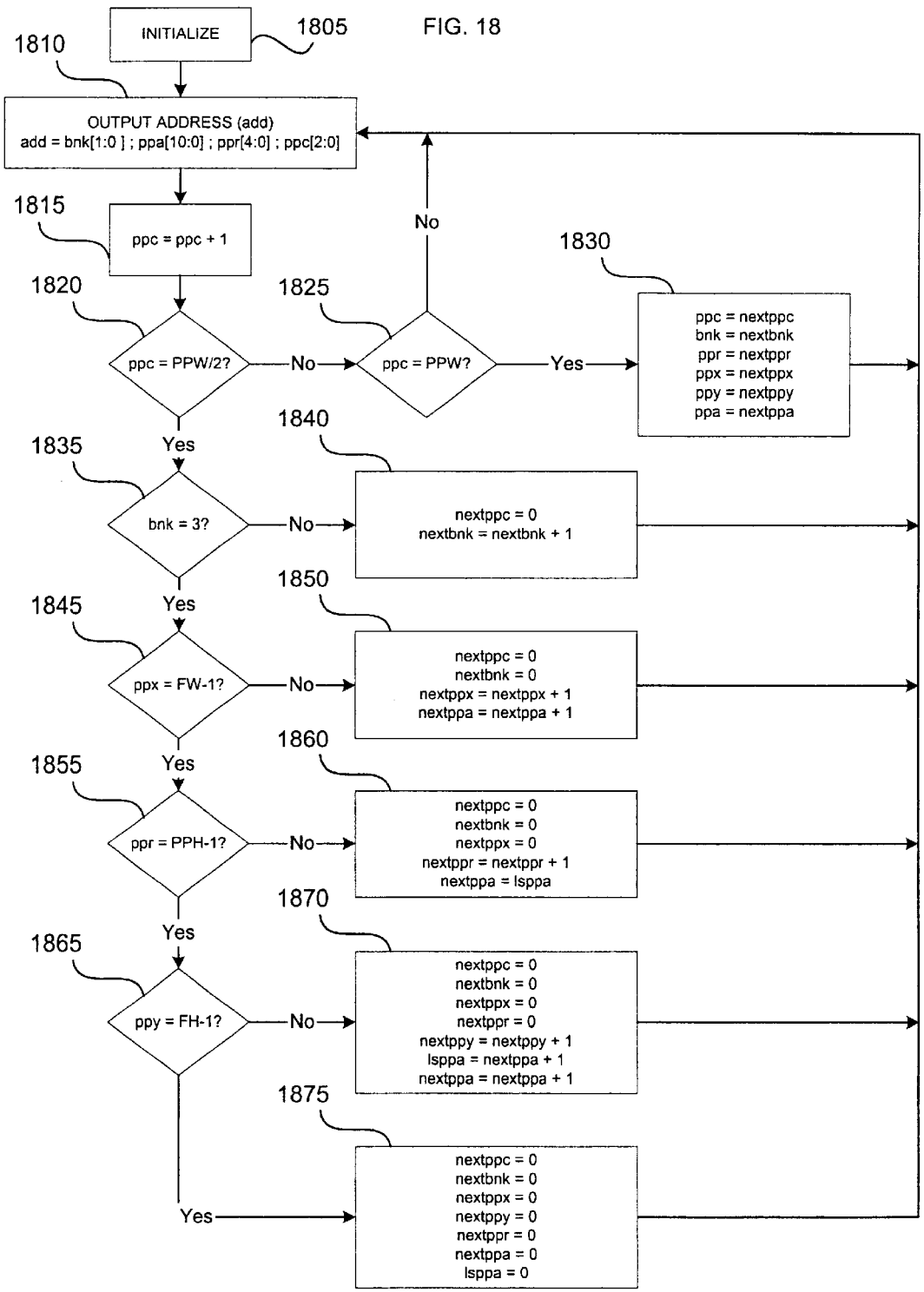
FIG. 18 is a flowchart of generating source addresses for storing pixel data according to the present invention.
Figure 20:
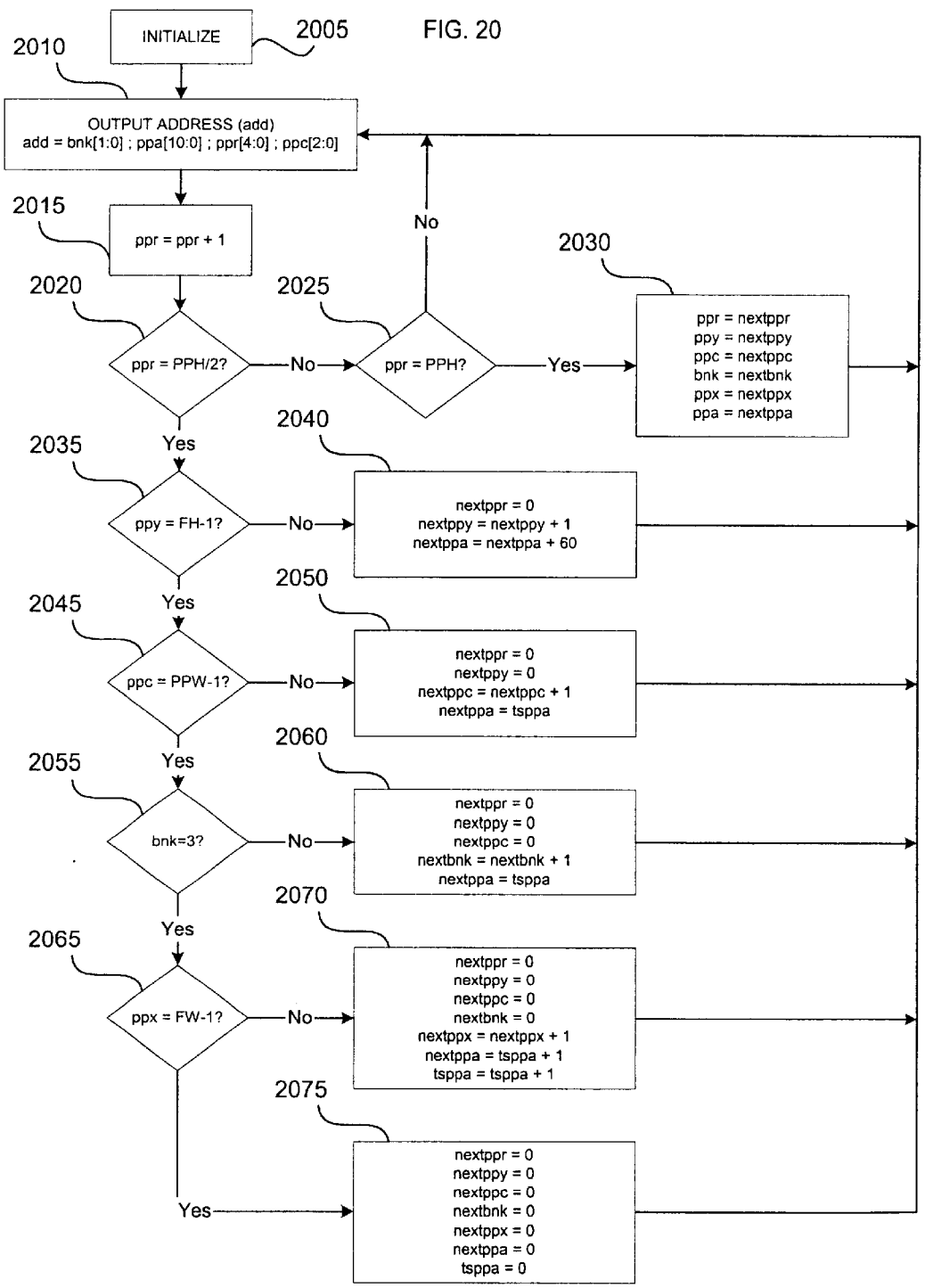
FIG. 20 is a flowchart of generating destination addresses for retrieving pixel data according to the present invention.

In one implementation, memory controller 1355 generates source addresses for storing pixel data and destination addresses for retrieving pixel data using several counter variables. FIG. 17 illustrates generating an address from counter variables. FIGS. 18 and 20, as described below, show flowcharts for incrementing counter variables as needed for generating source and destination addresses, respectively.

As described above, one implementation uses architecture 1300, a pixel page geometry of 8×32, and allocates 240 pixel pages horizontally and 34 pixel pages vertically. Several counter variables are shown in FIGS. 17, 18, and 20. These counter variables can be values stored in memory or separate counters. "add" is the 21-bit address generated and output by memory controller 1355. As described below, add is the 21-bit address 1725 shown in FIG. 17. In an alternative implementation, add is mathematically derived from the variables ppc, ppr, ppa, and bnk.

"ppc" counts pixel page columns. "ppr" counts pixel page rows. Combining ppc and ppr indicates a pixel within a pixel page and also a memory location within a memory page. Values for this combination are shown in column 1545 in FIG. 15. "ppx" counts pixel pages horizontally. "ppy" counts pixel pages vertically. "ppa" indicates one pixel page among the pixel pages stored in a bank of the memory being accessed. ppa also indicates the memory page in a bank storing the pixel page indicated by ppa. Values for ppa are shown in column 1540 in FIG. 15. "bnk" indicates one of four banks in the memory being accessed. Values for bnk are shown in column 1535 in FIG. 15. As described above, in one implementation, pixel data for horizontally neighboring pixel pages is stored in different memory banks (0, 1, 2, 3, 0, etc.) to take advantage of burst accessing while storing pixel data. bnk tracks which bank to store data to or retrieve data from according to this sequence.

As shown FIG. 17, the combination of ppc, ppr, ppa, and bnk form a 21-bit address. For a pixel page geometry of 8×32, ppc ranges from 0 to 7 and can be represented by three bits 1705. ppr ranges from 0 to 31 and can be represented by five bits 1710. ppa ranges from 0 to 2039 (60 pixel pages horizontally per bank by 34 pixel pages vertically) and can be represented by 11 bits 1715. bnk ranges from 0 to 3 and can be represented by two bits 1720. Memory controller 1355 combines these bits 1705, 1710, 1715, 1720 to form a 21-bit address 1725, add. Bits of address 1725 are numbered from A0 to A20. As shown in FIG. 17, ppc bits 1705 become address bits A0–A2. ppr bits 1710 become address bits A3–A7. ppa bits 1715 become address bits A8–A18. bnk bits 1720 become address bits A19–A20.

"nextppc," "nextppr," "nextppx," "nextppy," "nextppa," and "nextbnk" are holding variables for assignment. In FIG. 18, "lsppa" indicates a pixel page at the left side of the frame, and is used for the address to start from when generating addresses at the beginning of a row of pixels. In FIG. 20, "tsppa" indicates a pixel page at the top side of the frame, and is used for the address to start from when generating addresses at the beginning of a column of pixels.

Several constants are also shown in FIGS. 18 and 20. "FW" is the frame width, indicating the number of pixel pages allocated horizontally stored within one bank of the memory being accessed. As described above, using 8×32 pixel pages, 240 pixel pages are allocated horizontally. 60 pixel pages are stored for each row of pixel pages in each bank. Accordingly, FW is 60 in this implementation. "FH" is the frame height, indicating the number of pixel pages allocated vertically. FH is 34 in this implementation. "PPW" is the pixel page width, indicating the width of a pixel page in pixels. Using a pixel page geometry of 8×32, PPW is 8. "PPH" is the pixel page height, indicating the height of a pixel page in pixels. Using a pixel page geometry of 8×32, PPH is 32.

FIG. 18 is a flowchart of generating source addresses for storing pixel data. At the beginning of storing pixel data for a frame, memory controller 1455 resets the variables ppc, ppr, ppx, ppy, ppa, bnk, nextppc, nextppr, nextppx, nextppy, nextppa, nextbnk, and lsppa to 0, block 1805. FW, FH, PPW, and PPH do not change from frame to frame. Memory controller 1355 generates add as shown in FIG. 17 and outputs the value of add as the address, block 1810. Memory controller 1355 increments ppc by 1, block 1815. Memory controller 1355 compares ppc with PPW/2, block 1820. PPW/2 indicates the horizontal middle of the pixel page. Where PPW is 8, PPW/2 is 4. In some implementations, the amount of time required to perform some of the calculations in FIG. 18 may be more than a pixel time, and so using PPW/2 as a branching point allows more time for some calculations to complete. Accordingly, processing may move from one block to another in FIG. 18 before the calculation shown in a block has completed. Alternatively, a value other than the horizontal middle of the pixel page can be used.

If ppc does not equal PPW/2, memory controller 1355 checks if the end of a pixel page has been reached by comparing ppc with PPW, block 1825. If ppc does not equal PPW, the end of the pixel page has not been reached, and memory controller 1355 proceeds to block 1810. If ppc equals PPW, the end of the pixel page has been reached. Memory controller 1355 prepares for the next pixel page by assigning counter variables the values of corresponding holding variables, block 1830, and proceeds to block 1810.

Returning to block 1820, if ppc equals PPW/2, memory controller 1355 checks if the last bank in the sequence of banks has been reached by comparing bnk with 3, block 1835. As described above, pixel pages are stored in a sequence of banks (0, 1, 2, 3, 0, etc.) to take advantage of burst accessing while storing pixel data. In an implementation where each memory has more or less than 4 banks, memory controller 1355 compares bnk with one less than the number of banks in each memory. If bnk does not equal 3, the last bank has not been reached. Memory controller 1355 prepares holding variables for the end of the pixel page row (to be used in block 1830), block 1840, and proceeds to block 1810.

If bnk equals 3, the last bank has been reached, and memory controller 1355 checks if the last pixel page in the row of pixel pages has been reached by comparing ppx with FW−1, block 1845. Where FW is 60, FW−1 is 59. When bnk equals 3 and ppx equals FW−1, the last pixel page in the row of pixel pages has been reached. If ppx does not equal FW−1, the last pixel page in the row has not been reached. Memory controller 1355 prepares holding variables for the end of the pixel page row (to be used in block 1830), block 1850, and proceeds to block 1810.

If ppx equals FW−1, the last pixel page in the row has been reached, and memory controller 1355 checks if the last pixel page row in the pixel page has been reached by comparing ppr with PPH−1, block 1855. Where PPH is 32, PPH−1 is 31. If ppr does not equal PPH−1, the last pixel page row has not been reached. Memory controller 1355 prepares holding variables for the end of the pixel page row (to be used in block 1830), block 1860, and proceeds to block 1810.

If ppr equals PPH−1, the last pixel page row has been reached, and memory controller 1355 checks if the last pixel page in the column of pixel pages has been reached by comparing ppy with FH−1, block 1865. Where FH is 34, FH−1 is 33. If ppy does not equal FH−1, the last pixel page in the column has not been reached. Memory controller 1355 prepares holding variables for the end of the pixel page row (to be used in block 1830), block 1870, and proceeds to block 1810. If ppy equals FH−1, the last pixel page in the column has been reached. Memory controller 1355 prepares holding variables for the end of the pixel page row (to be used in block 1830), block 1875, and proceeds to block 1810. FIG. 18 shows a continuous loop and so memory controller 1355 continues to follow FIG. 18 from frame to frame for storing pixel data. If memory controller 1355 needs to re-start address generation for storing pixel data, such as to reinitialize the state of address generation, memory controller 1355 starts generating addresses again beginning with block 1805.

Memory controller 1355 retrieves pixel data according to vertical columns of pixels. Memory controller 1355 generates destination addresses to retrieve pixel data for one pixel at a time, in parallel with storing pixel data for a different pixel, as described above. In an HD resolution implementation, memory controller 1355 retrieves pixel data for pixels in this sequence: 0, 1920, 3840, and so on.

Referring to FIG. 15, memory controller 1355 generates addresses in the following sequence (memory bank-memory page-memory address): 0-0-0, 0-0-8, 0-0-16, . . . , 0-0-240, 0-60-0, 0-60-8, . . . , 0-1980-240, 1-0-0, 1-0-8, and so on. As described above, pixel data for pixels in different pixel pages is retrieved from different memory pages.

Figure 19:
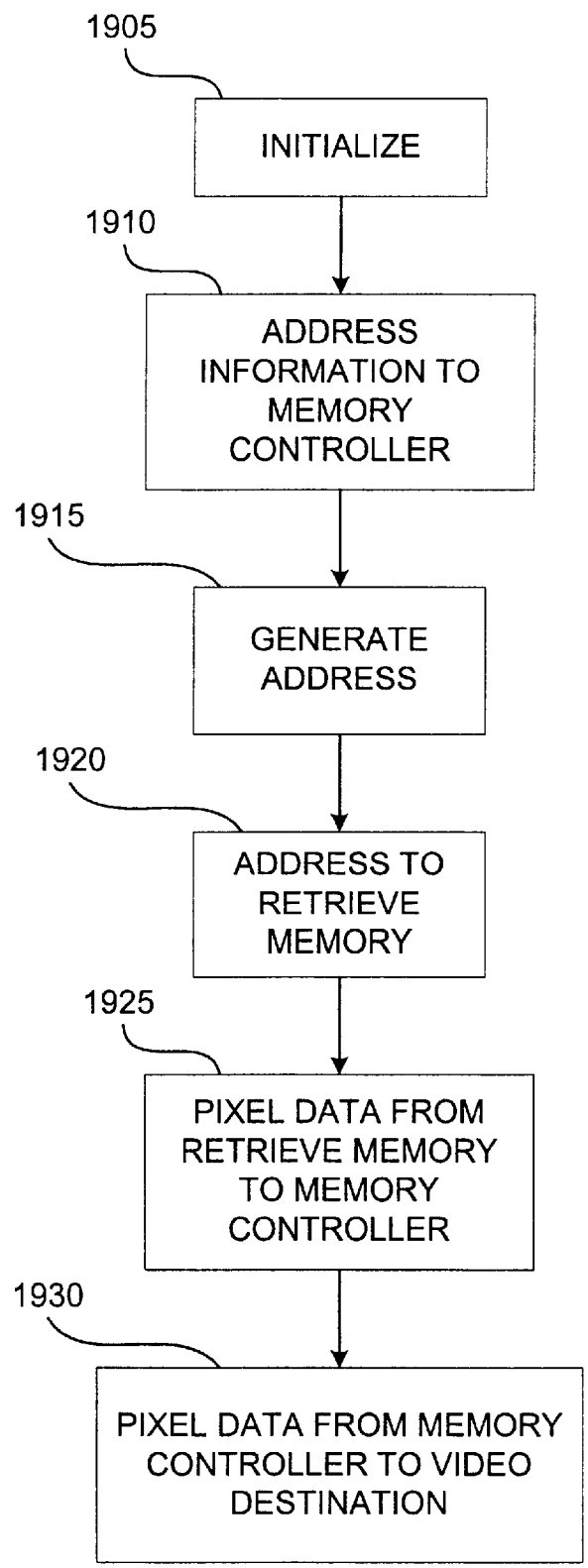
FIG. 19 is a flowchart of retrieving pixel data according to the present invention.

FIG. 19 is a flowchart of retrieving pixel data. To retrieve pixel data, one of memories 1310, 1315 is the retrieve memory according to the state of memory controller 1355 for memory alternation, as described above. Memory controller 1355 puts the retrieve memory in read mode and memory controller 1355 is set to provide pixel data from the retrieve memory to video destination 1325, block 1905. Video destination 1325 provides address information to memory controller 1355 through control line 1335, block 1910. The address information indicates that memory controller 1355 is to read data from one of memories 1310, 1315, such as by indicating whether a frame has been completely retrieved. Alternatively, video destination 1325 provides the address information to memory controller 1355 once at the beginning of retrieval, such as at block 1905. Memory controller 1355 generates a destination address as described below to retrieve the pixel data, block 1915. In alternative implementations, video destination 1325 can generate the addresses for retrieving pixel data and pass the addresses to memory controller 1355.

Memory controller 1355 provides the destination address to the retrieve memory through the respective memory address bus (i.e., memory address bus 1365 for memory 1310 or memory address bus 1375 for memory 1315), block 1920. The retrieve memory provides the pixel data stored at the address on the connected memory address bus to memory controller 1355 through the connected memory data bus (i.e., memory data bus 1360 for memory 1310 or memory data bus 1370 for memory 1315), block 1925. Memory controller 1355 provides the pixel data from the retrieve memory to video destination 1325 through data bus 1327, block 1930. To retrieve pixel data for the next pixel, video destination returns to block 1910, or to block 1905 to restore the state of architecture 1300 for retrieval.

FIG. 20 is a flowchart of generating destination addresses for retrieving pixel data. At the beginning of retrieving pixel data for a frame, memory controller 1355 resets the variables ppc, ppr, ppx, ppy, ppa, bnk, nextppc, nextppr, nextppx, nextppy, nextppa, nextbnk, and tsppa to 0, block 2005. FW, FH, PPW, and PPH do not change from frame to frame. Memory controller 1355 generates add as shown in FIG. 17 and outputs the value of add as the address, block 2010. Memory controller 1355 increments ppr by 1, block 2015. Memory controller 1355 compares ppr with PPH/2, block 2020. PPH/2 indicates the vertical middle of the pixel page. Where PPH is 32, PPH/2 is 16. As described above referring to FIG. 18, using PPH/2 as a branching point allows more time for some calculations to complete.

If ppr does not equal PPH/2, memory controller 1355 checks if the end of a pixel page has been reached by comparing ppr with PPH, block 2025. If ppr does not equal PPH, the end of the pixel page has not been reached, and memory controller 1355 proceeds to block 2010. If ppr equals PPH, the end of the pixel page has been reached. Memory controller 1355 prepares for the next pixel page by assigning counter variables the values of corresponding holding variables, block 2030, and proceeds to block 2010.

Returning to block 2020, if ppr equals PPH/2, memory controller 1355 checks if the last pixel page in the column of pixel pages has been reached by comparing ppy with FH−1, block 2035. Where FH is 34, FH−1 is 33. If ppy does not equal FH−1, the last pixel page in the column has not been reached. Memory controller 1355 prepares holding variables for the end of the pixel page column (to be used in block 2030), block 2040, and proceeds to block 2010.

If ppy equals FH−1, the last pixel page in the column has been reached, and memory controller 1355 checks if the last pixel page column in the pixel page has been reached by comparing ppc with PPW−1, block 2045. Where PPW is 8, PPW−1 is 7. If ppc does not equal PPW−1, the last pixel page column has not been reached. Memory controller 1355 prepares holding variables for the end of the pixel page column (to be used in block 2030), block 2050, and proceeds to block 2010.

If ppc equals PPW−1, the last pixel page column has been reached, and memory controller 1355 checks if the last bank in the sequence of banks has been reached by comparing bnk with 3, block 2055. As described above, pixel pages are stored in a sequence of banks (0, 1, 2, 3, 0, etc.) to take advantage of burst accessing while storing pixel data. In an implementation where each memory has more or less than 4 banks, memory controller 1355 compares bnk with one less than the number of banks in each memory. If bnk does not equal 3, the last bank has not been reached. Memory controller 1355 prepares holding variables for the end of the pixel page row (to be used in block 1830), block 2060, and proceeds to block 1810.

If bnk equals 3, the last bank has been reached, and memory controller 1355 checks if the last pixel page in the row of pixel pages has been reached by comparing ppx with FW−1, block 2065. Where FW is 60, FW−1 is 59. When bnk equals 3 and ppx equals FW−1, the last pixel page in the row of pixel pages has been reached. If ppx does not equal FW−1, the last pixel page in the row has not been reached. Memory controller 1355 prepares holding variables for the end of the pixel page column (to be used in block 2030), block 2070, and proceeds to block 2010. If ppx equals FW−1, the last pixel page in the row has been reached. Memory controller 1355 prepares holding variables for the end of the pixel page column (to be used in block 2030), block 2075, and proceeds to block 2010. Similar to FIG. 18, FIG. 20 shows a continuous loop and so memory controller 1355 continues to follow FIG. 20 from frame to frame for retrieving pixel data. If memory controller 1355 needs to re-start address generation for retrieving pixel data, such as to re-initialize the state of address generation, memory controller 1355 starts generating addresses again beginning with block 2005.

In alternative implementations, addresses generation for storing and retrieving pixel data can be different from that described above. For example, blocks 1820 and 1825 in FIG. 18 could be combined into a multi-branch block with outgoing paths depending on the value of ppc: one for ppc=PPW/2, one for ppc=PPW, and one for other values of ppc. In any case, the address generation used accommodates the storage pattern created by the pixel pages and the sequences for storing and retrieving data described above.

Various illustrative implementations of the present invention have been described. The above description focuses on HD resolution video data displayed using a GLV system, but the methods and apparatus can be applied to different resolutions. Similarly, the pixel data for a pixel is described above as being 32 bits, but different depths are also possible with modification to the size of the addressed memory locations. Implementations based on those described in U.S. application Ser. No. 10/051,538 (filed Jan. 16, 2002) can also be made, such as ones storing multiple pixels in parallel and retrieving multiple pixels in parallel or using bit-field addressing by allocating pixel pages in blocks having a number of pixel pages equal to a power of two. Pixel pages optimized for a GLV can also be used with a checkerboard buffer, as described in U.S. application Ser. No. 09/908,295 (filed Jul. 17, 2001), which is incorporated herein by reference.

The present invention can be implemented in electronic circuitry, computer hardware, software, or in combinations of them. For example, a frame buffer using pixel pages can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A method of storing and retrieving pixel data, comprising:

storing pixel data for a first frame of pixels in a first memory device using pixel pages, where the first memory device includes a plurality of memory pages, and at least one memory page stores pixel data for at least two pixels from each of at least two horizontal rows of pixels in the first frame of pixels;

storing pixel data for a second frame of pixels in a second memory device using pixel pages, where the second memory device includes a plurality of memory pages, and at least one memory page stores pixel data for at least two pixels from each of at least two horizontal rows of pixels in the second frame of pixels;

retrieving pixel data for the first frame of pixels from the first memory device using pixel pages; and retrieving pixel data for the second frame of pixels from the second memory device using pixel pages, where the pixel pages are optimized for use with a GLV.

2. The method of claim 1, further comprising providing retrieved pixel data to a GLV system.

3. The method of claim 1, where each pixel page has a pixel page geometry of 16×16.

4. The method of claim 1, where each pixel page has a pixel page geometry of 8×32.

5. The method of claim 1, where storing pixel data includes using burst accessing to hide page misses.

6. The method of claim 1, where pixel data for the second frame of pixels is stored and pixel data for the first frame of pixels is retrieved in parallel.

7. The method of claim 1, where pixel data is stored to the first memory device while pixel data is retrieved from the second memory device, and pixel data is retrieved from the first memory device while pixel data is stored to the second memory device.

8. The method of claim 1, where the memory devices switch between storing and retrieving with each frame of pixels.

9. The method of claim 1, where each memory device includes two or more memory banks and where pixel data for horizontally neighboring pixel pages is stored in different memory banks.

10. The method of claim 1, where each memory device includes two or more memory banks and where pixel data for vertically neighboring pixel pages is stored in different memory banks.

11. A system for storing and retrieving pixel data, comprising:

means for storing pixel data for a first frame of pixels in a first memory device using pixel pages, where the first memory device includes a plurality of memory pages, and at least one memory page stores pixel data for at least two pixels from each of at least two horizontal rows of pixels in the first frame of pixels;

means for storing pixel data for a second frame of pixels in a second memory device using pixel pages, where the second memory device includes a plurality of memory pages, and at least one memory page stores pixel data for at least two pixels from each of at least two horizontal rows of pixels in the second frame of pixels;

means for retrieving pixel data for the first frame of pixels from the first memory device using pixel pages; and means for retrieving pixel data for the second frame of pixels from the second memory device using pixel pages, where the pixel pages are optimized for use with a GLV.

* * * * *